United States Patent
Wakisaka et al.

(10) Patent No.: US 6,810,049 B2
(45) Date of Patent: Oct. 26, 2004

(54) SEMICONDUCTOR LASER DEVICE AND SEMICONDUCTOR LASER MODULE

(75) Inventors: Tsuyoshi Wakisaka, Tokyo (JP); Naoki Tsukiji, Tokyo (JP); Junji Yoshida, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 212 days.

(21) Appl. No.: 10/080,121

(22) Filed: Feb. 22, 2002

(65) Prior Publication Data

US 2002/0121671 A1 Sep. 5, 2002

(30) Foreign Application Priority Data

Mar. 2, 2001 (JP) .......... 2001-059325
Oct. 17, 2001 (JP) .......... 2001-319847

(51) Int. Cl.[7] .................... H01S 3/00
(52) U.S. Cl. .................... 372/36; 372/43
(58) Field of Search .............. 372/36, 43–50

(56) References Cited

U.S. PATENT DOCUMENTS

| | | | | |
|---|---|---|---|---|
| 4,338,577 A | * | 7/1982 | Sato et al. | 372/36 |
| 4,399,541 A | * | 8/1983 | Kovats et al. | 372/36 |
| 4,802,178 A | * | 1/1989 | Ury | 372/36 |
| 6,219,364 B1 | * | 4/2001 | Dei | 372/36 |
| 6,359,330 B1 | * | 3/2002 | Goudard | 257/678 |

FOREIGN PATENT DOCUMENTS

| | | |
|---|---|---|
| DK | 4422322 | 9/1995 |
| EP | 0 853 358 | 7/1998 |
| JP | 08-335747 | 12/1996 |
| JP | 10-247757 | 9/1998 |
| JP | Hei 11-26887 | 1/1999 |
| JP | 11-097801 | 4/1999 |
| JP | 2000-340876 | 9/2000 |

OTHER PUBLICATIONS

Design, Sumulation and Technological Realization of a Reliable Packaging Concept for High Laser Bars, Stefan Weiss et al, Electronic Components & Technology Conference, 1988, 48th IEEE Seattle, WA, May 25–28, 1998, pp. 1395–1401.

* cited by examiner

*Primary Examiner*—Quyen Leung
(74) *Attorney, Agent, or Firm*—Oblon, Spivak, McClelland, Maier & Neustadt, P.C.

(57) ABSTRACT

A semiconductor laser element for outputting a laser beam, a thermistor for measuring the temperature of the semiconductor laser element, and a carrier having an insulating characteristic and a high heat conductivity, in which the semiconductor laser element and the thermistor are joined to the carrier through a multi-layer film including a gold film so that the temperature of the semiconductor laser element is accurately measured and controlled.

90 Claims, 14 Drawing Sheets

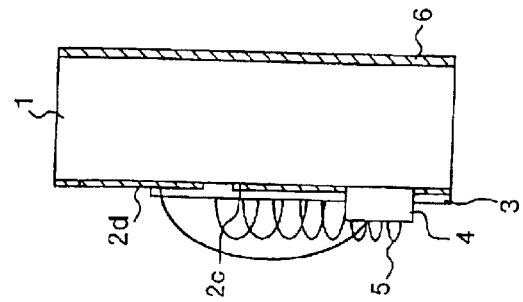
FIG.1C
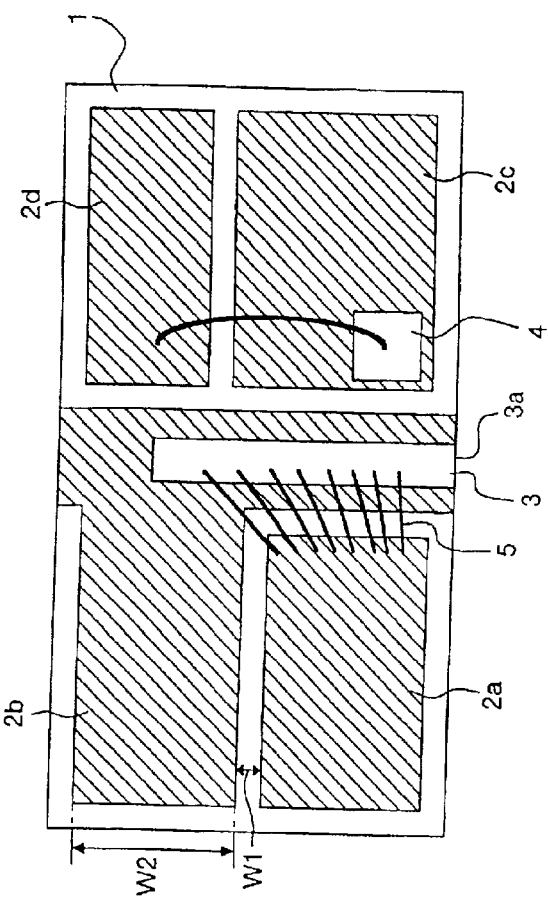
FIG.1A
FIG.1B
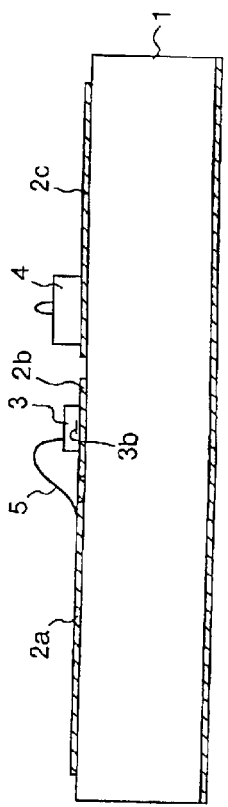

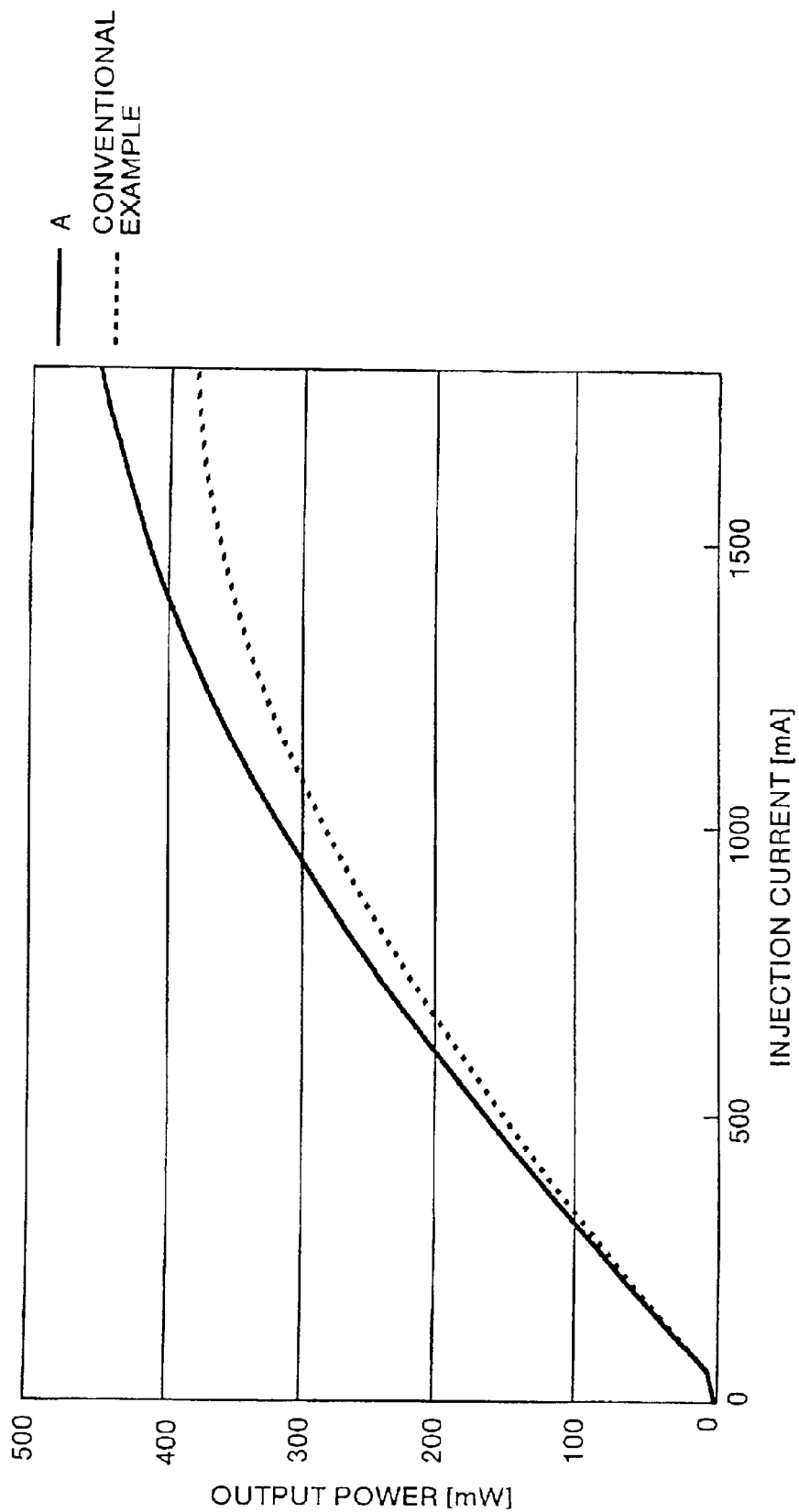

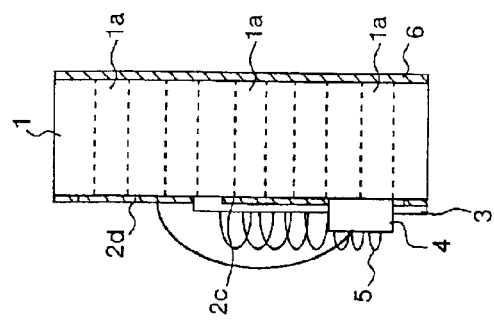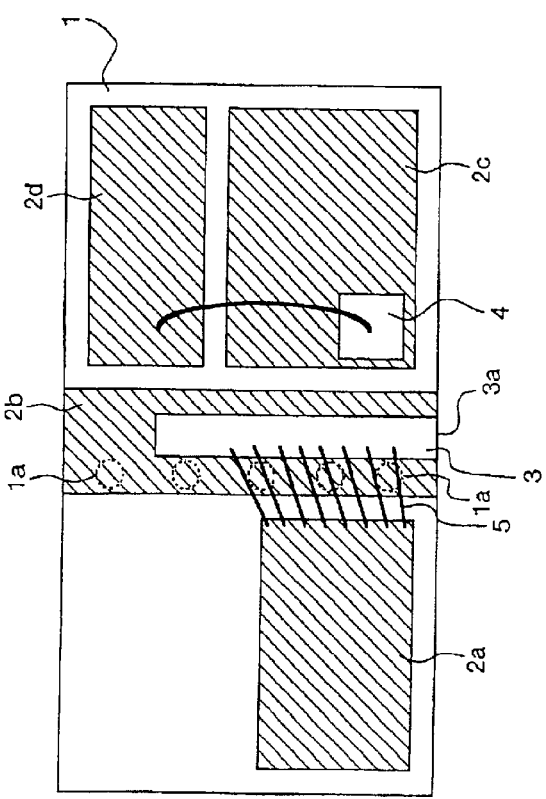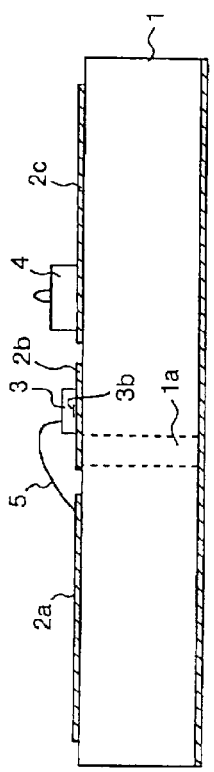

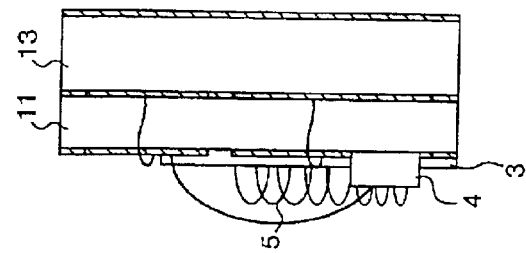
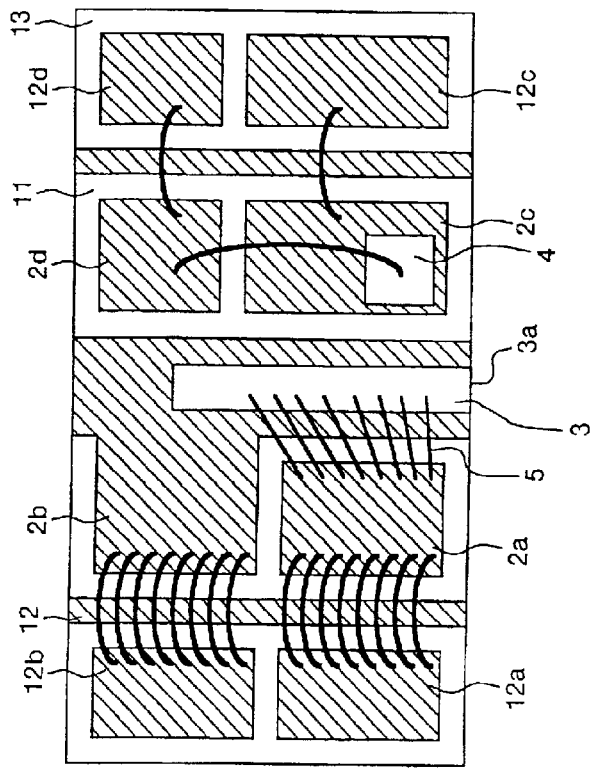
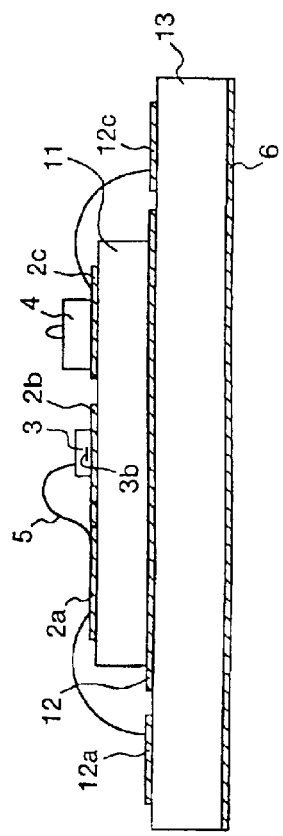

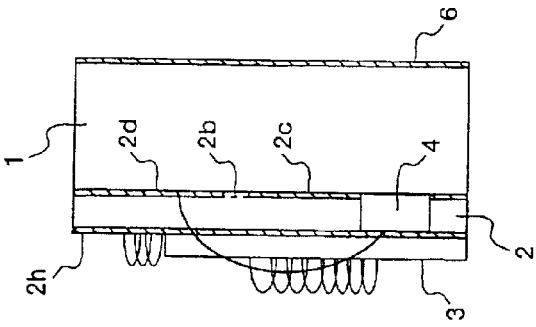
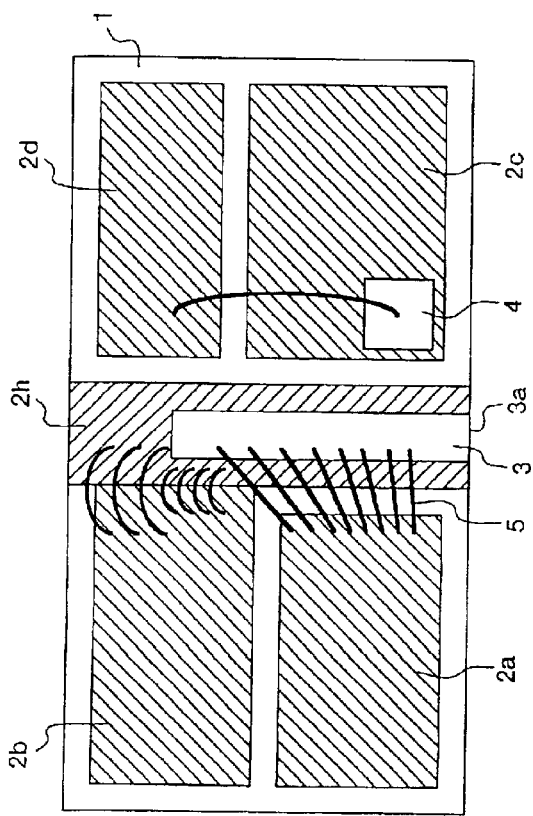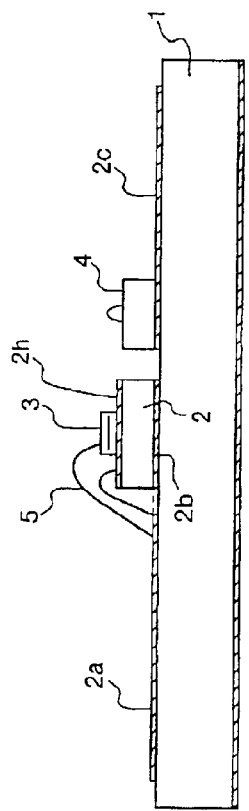

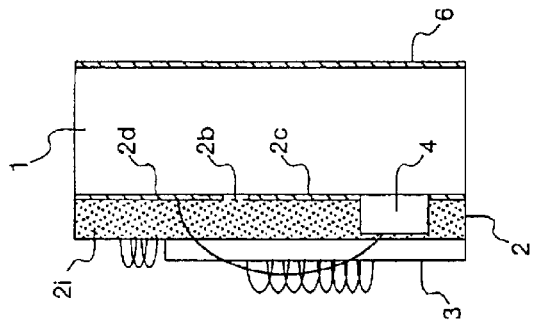
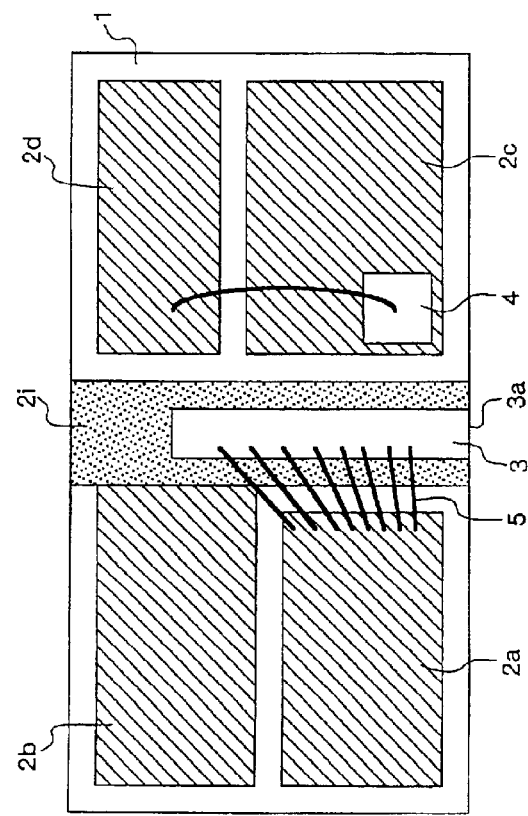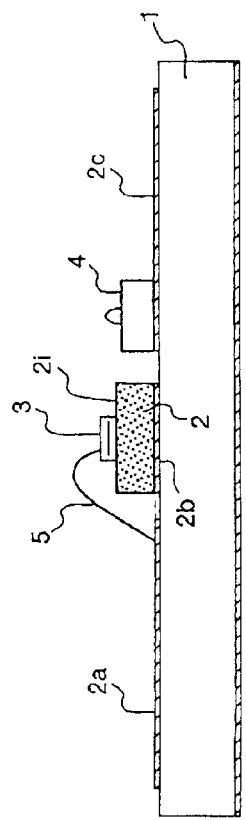

US 6,810,049 B2

SEMICONDUCTOR LASER DEVICE AND SEMICONDUCTOR LASER MODULE

FIELD OF THE INVENTION

The present invention relates to a semiconductor laser device having a greatly stabilized oscillation wavelength to output a high output laser beam and a semiconductor laser module.

BACKGROUND OF THE INVENTION

A demand for increasing the capacity of optical communication networks has been recently heightened because of a proliferation of various multimedia including Internet-delivered multimedia. Responsive to the demand, a WDM (Wavelength Division Multiplexing) communication system has been used. The WDM communication system is a system for performing transmission by using a plurality of wavelengths in a 1,550-nm band. The WDM communication system realizes a remarkable increase of the transmission capacity of a network because optical signals having a plurality of different wavelengths are simultaneously transmitted through one optical fiber and thereby it is unnecessary to construct a new line.

In the case of the light source, or the amplifying light source, of the optical signal, it is desired to accurately control the oscillation wavelength and operate a semiconductor laser element at a high optical output by preventing the thermal saturation of the element. Conventional semiconductor laser devices prevent an oscillation wavelength from becoming unstable, and a semiconductor laser element for outputting a laser beam from being thermally saturated, by setting a thermistor for measuring the temperature of the semiconductor laser element nearby the semiconductor laser element and controlling the temperature of the semiconductor laser element by a temperature controlling element such as a Peltier element.

FIG. 15 is a perspective view of a schematic configuration of a conventional semiconductor laser device. In the case of the semiconductor laser device in FIG. 15, a submount 102 formed by AlN having an insulating characteristic and a high heat conductivity is formed on a carrier 101 formed by CuW and a semiconductor laser element 103 for outputting a laser beam L100 having a predetermined wavelength is formed on the submount 102. A submount 104 formed by AlN is formed on the carrier 101 and a thermistor 105 for measuring the temperature of a semiconductor laser element is formed on the submount 104.

The semiconductor laser element 103 and the submount 102 are joined through a metallic thin film 102a. The metallic thin film 102a is metallized with Ti, Pt, and Au at film thicknesses of 60, 200, and 600 nm in order and the semiconductor laser element 103 and submount 102 are joined to each other by a solder material made of AuSn or the like metallized on the Au film. Moreover, the thermistor 105 and submount 104 are joined each other similarly through the metallic thin film 104a.

In the case of the semiconductor laser element 103, the face to be joined with the submount 102 serves as a p-side electrode and the upper face serves as an n-side electrode and an active layer for mainly generating heat is set nearby the submount 102. A negative electrode is led to the n-side electrode by an Au wire 106a and the p-side electrode is led to the positive side carrier 101 through the metallic thin film 102a and an Au wire 106b.

Referring to FIG. 16, the submount 102 secures the insulation of the semiconductor laser element 103 and functions as a heat sink of the semiconductor laser element 103 and is joined to a CuW base 106 to be joined to the bottom of the carrier 101 by AuSn solder, and a Peltier module 107 set to the bottom of the base controls the temperature of the semiconductor laser element 103 in accordance with the temperature detected by the thermistor 105.

Moreover, the thermistor 105 is also insulated from the carrier 101 by the submount 104 similarly to the case of the semiconductor laser element 103 to detect the temperature of the semiconductor laser element 103 through the submount 102, carrier 101, and submount 104 respectively having a high heat conductivity.

When performing long distance optical transmission by using the above WDM communication system, it is desireable to increase the output of a laser beam of a signal light source in order to increase the interval between repeaters. Moreover, to improve the amplification capacity of an optical fiber amplifier, it is desirable to increase the output of a semiconductor laser device used for an exciting light source.

To meet the above demands, a conventional embodiment has a semiconductor laser element for oscillating and outputting a laser beam of 250 mW or more as a laser beam for Erbium doped fiber amplifier (EDFA) excitation. However, a conventional semiconductor laser device using the above high output semiconductor laser element has a problem in that the optical output and service life of the semiconductor laser element are deteriorated.

FIG. 16 shows a front view of the above conventional semiconductor laser device including the above described base and Peltier module. The submounts 102 and 104 are separately provided for the semiconductor laser element 103 and the thermistor 105. The heat generated in the semiconductor laser element 103 is conducted to the thermistor 105 through the metallic thin film 102a, submount 102, metallic thin film 102b, carrier 101, metallic thin film 104b, submount 104, and metallic thin film 104a in order as shown by the arrow YA in FIG. 16. As recognized by the present inventors, because the heat conducting distance is physically increased as described above, detection of the actual temperature of the semiconductor laser element 103 is delayed.

Moreover, because the total of four junction faces corresponding to the metallic thin films 102a, 102b, 104b, and 104a are present on the heat conducting path between the semiconductor laser element 103 and the thermistor 105, heat resistances are generated on these junction faces and thereby, the temperature of the semiconductor laser element 103 is not accurately transferred to the thermistor 105. That is, the thermistor 105 detects a lower temperature having a large difference from the actual temperature of the semiconductor laser element 103 and therefore, the accuracy of a detected temperature is deteriorated. As a result, the temperature control of the semiconductor laser element 103 performed in accordance with the temperature detected by the thermistor 105 is delayed and because the temperature control at a low accuracy is inevitably performed, the oscillation wavelength of the semiconductor laser element 103 becomes unstable and the optical output and service life of the semiconductor laser element 103 are deteriorated.

Moreover, as shown by the arrow YB in FIG. 16, because the total of four junction faces such as two junction faces corresponding to the metallic thin films 102a and 102b, the junction face between the carrier 101 and the base 106, and the junction face between the base 106 and the Peltier module 107 are present on the heat conducting path between the semiconductor laser element 103 and the Peltier module 107, the heating action or cooling action by the Peltier module 107 is deteriorated whenever passing through these junction faces and resultantly, the temperature control of the semiconductor laser element 103 cannot be quickly or accurately performed.

Moreover, when supplying a current of 1 A or more to a semiconductor laser element in order to obtain a high optical output and assuming that the total resistance of an Au thin film in the metallic thin film 102a is 0.12Ω, the voltage drop by the Au thin film becomes 0.12 V. Moreover, because the inter-electrode voltage of a semiconductor laser element is approximately 2 V when a current of 1 A is supplied to the semiconductor laser element, the voltage drop of the semiconductor laser element in the resonator length direction becomes un-uniform by 0.12 V. That is, also when considering a current injection path, current injection into a semiconductor laser element becomes ununiform because of passing through a metallic thin film and resultantly, the light density in the active layer becomes ununiform and it is estimated to accelerate the deterioration of the optical output and service life of the semiconductor laser element.

When using a high output semiconductor laser element, it is recognized by the present inventors that it is imprudent to ignore the voltage drop in the metallic thin film between the semiconductor laser element and a submount. If too high, an oscillation wavelength becomes unstable due to the non-uniformity of the voltage drop in the metallic thin film in the resonator length direction. This problem particularly becomes troublesome in the case of a semiconductor laser element designed for a high output operation at a resonator length of 1,000 μm or more.

SUMMARY OF THE INVENTION

It is an object of the present invention to address the above-described and other deficiencies of conventional devices and modules.

It is another object of this invention to provide a semiconductor laser device and a semiconductor laser module capable of preventing the optical output and service life of a high output semiconductor laser element from deteriorating. This is achieved by using new materials to reduce the number of interfaces between a laser element and a temperature measuring device, as well as a reduction in the number of interfaces between a laser element and a Peltier module. In addition, performance is enhanced by improving the uniformity of voltage drop of the semiconductor laser element in the resonator length direction by distributing driving currents along a length of the resonator cavity.

The first aspect of the present invention includes a semiconductor laser device including a semiconductor laser element for outputting a laser beam, a temperature measuring element for measuring the temperature of the semiconductor laser element, and a carrier having an insulating characteristic and a high heat conductivity, wherein the semiconductor laser element and the temperature measuring element are joined to the carrier through a multi-layer film that includes a gold thin film and are arranged closely to each other such that the heat resistance of a heat conducting path decreases. Within the first aspect, variations in the pattern of the multi-layer film are possible. In addition, the carrier may also include rods of thermally conductive material.

The second aspect of the present invention includes a semiconductor laser device including a semiconductor laser element for outputting a laser beam, a temperature measuring element for measuring the temperature of the semiconductor laser element, a carrier having an insulating characteristic and a high heat conductivity, and a common laser and temperature measure device submount having a heat conductivity of 500 W/(m·K) or more joined to the carrier through a multi-layer film that includes a gold thin film. The semiconductor laser element and the temperature measuring element are each joined to the common submount via multi-layer film that includes a gold thin film and are arranged closely to each other such that the heat resistance of a heat conducting path decreases.

The third aspect of the present invention includes a semiconductor laser device including a semiconductor laser element for outputting a laser beam, a temperature measuring element for measuring the temperature of the semiconductor laser element, an optical monitor for monitoring the output of the laser element, and a carrier having an insulating characteristic and a high heat conductivity, wherein the semiconductor laser element, the temperature measuring element and the optical monitor are joined to the carrier through a multi-layer film that includes a gold thin film and are arranged closely to one another such that the heat resistance of a heat conducting path decreases.

The fourth aspect includes a semiconductor laser device having a semiconductor laser element for outputting a laser beam, a temperature measuring element for measuring the temperature of the semiconductor laser element, a carrier having an insulating characteristic and a high heat conductivity, and laser submount having a heat conductivity of 500 W/(m·K) or more and a joined to the carrier through a multi-layer film that includes a gold thin film. The temperature measuring element is joined directly to the carrier through a multi-layer film that includes a gold thin film and is arranged closely to the semiconductor laser device such that the heat resistance of a heat conducting path decreases. Within the fourth aspect, variations regarding the size and other characteristics of the laser submount are possible.

According to the first through fourth aspects, the heat resistance of the heat conducting path is decreased by using three or less junction faces located on the heat conducting path between the semiconductor laser element and the temperature measuring element and respectively formed by the multi-layer film including the gold thin film.

The fifth aspect of the present invention includes a semiconductor laser module having the semiconductor laser device of any of the above aspects and a temperature controlling element for controlling the temperature of the semiconductor laser element in accordance with the temperature output from the temperature measuring element. In this aspect, the carrier of the semiconductor laser device is joined to the temperature controlling element and the semiconductor laser element is temperature controlled through the carrier.

BRIEF DESCRIPTION OF THE DRAWINGS

Other objects and features of this invention will become better understood from the following description with reference to the accompanying drawings.

FIGS. 1A to 1C show a configuration of a semiconductor laser device of the first embodiment of the present invention;

FIG. 3 is a graph which shows relations between injection currents and output powers of the semiconductor laser element of the semiconductor laser device shown in FIG. 1 and a conventional semiconductor laser element;

FIGS. 5A to 5C show a configuration of a semiconductor laser device that is a second modification of the first embodiment of the present invention;

FIGS. 6A to 6C show a configuration of a semiconductor laser device that is second embodiment of the present invention;

FIGS. 10A to 10C show a configuration of a semiconductor laser device that is fourth embodiment of the present invention;

FIGS. 12A to 12C show another configuration of the semiconductor laser device that is the fourth embodiment of the present invention;

DETAILED DESCRIPTION

Figure 2:
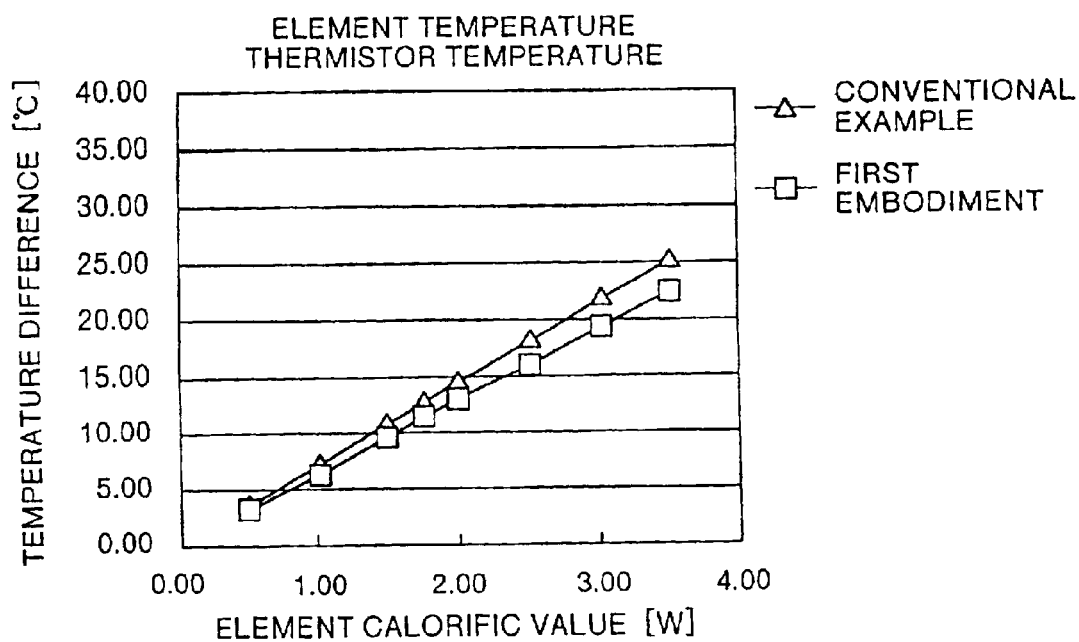
FIG. 2 is a graph which shows a difference between the temperature of the semiconductor laser element shown in FIG. 1 and the temperature of a thermistor to the calorific value of the semiconductor laser device.

Preferred embodiments of a semiconductor laser device and a semiconductor laser module of the present invention are described below by referring to the accompanying drawings.

FIG. 1A is a top view, FIG. 1B is a front view, and FIG. 1C is a right side view of the semiconductor laser device of the first embodiment of the present invention. In FIGS. 1A to 1C, a carrier 1 is formed AlN and having an insulating characteristic and a high heat conductivity. A semiconductor laser element 3 outputs a laser beam having a predetermined oscillation wavelength from an end face 3a and is set to this side of a center of an upper portion of the carrier 1 through a metallic thin film 2b. The resonator length of the semiconductor laser element 3 is 1,000 µm or more and the semiconductor laser element 3 outputs a high output laser beam of 250 mW or more. The laser beam output by the semiconductor laser element 3 has an oscillation wavelength of 900 to 1,600 nm in which a 980-nm band and a 1,480-nm band are especially useful in typical communication systems and the 1,480-nm band is particularly useful as an optical fiber amplifier exciting light source such as when used as a pump for a Raman amplifier.

A thermistor 4 is set on the carrier 1 through a metallic thin film 2c, which monitors the temperature of the semiconductor laser element 3. Other metallic thin films 2a and 2d are formed on the carrier 1, patterned, and insulated from each other. The metallic thin film 2b is formed by three layers of Ti, Pt, and Au from the carrier-1 side and the three layers have thicknesses of 60, 200, and 5,000 nm. That is, in contrast to the Au film of the metallic thin film 102a shown in FIG. 15 which has a thickness of 600 nm; the Au film of the metallic thin film 2b has a thickness of 5,000 nm. Thickness of at least, 1,000 nm, 2,000 nm, 3,000 nm, 4,000 nm may be used as well with increasing degrees of performance and aging improvement. However, 5,000 nm is preferred. Other metallic thin films 2a, 2c and 2d are formed simultaneously with the metallic thin film 2b and have the same film configuration. The semiconductor laser element 3 is joined with the metallic thin film 2b by AuSn solder through a Pt barrier layer.

In the case of the semiconductor laser element 3, the p-side electrode at the active layer-3b side is joined correspondingly to the carrier 1, and the n-side electrode is the upper face. The n-side electrode of the semiconductor laser element 3 and the metallic thin film 2a are electrically joined to each other by an Au wire 5. Therefore, the metallic thin film 2a serves as the negative electrode of the semiconductor laser element 3 and the metallic thin film 2b serves as the positive electrode of the semiconductor laser element 3.

The n-side electrode of the semiconductor laser element 3 and the metallic thin film 2a are connected to each other by a plurality of wires 5 so that a current carrying sectional area increases. Moreover, junction points of the wires 5 are arranged at almost equal intervals to disperse power and make the current distribution more uniform. By forming the above spatial wiring by a plurality of wires 5, a resistance value and a voltage drop decrease and thereby, generation of heat decreases, a power ratio only used for laser beam output is increased, and a power light conversion efficiency is improved.

Moreover, by setting thicknesses of Au films of the metallic thin films 2a to 2d to 5,000 nm or more, resistances of the metallic thin films 2a to 2d are decreased, voltage drops are decreased, and a power light conversion efficiency is improved conjointly with the function and advantage of the above wires 5. Moreover, when a large current is injected into the p-side electrode of the semiconductor laser element 3, it is possible to decrease the non-uniformity of voltage drops in the resonator length direction of the semiconductor laser element 3 and resultantly prevent the optical output and service life of the semiconductor laser element 3 from deteriorating.

In this case, it is preferable to make the width W2 of the metallic thin film 2b almost equal to the width of the metallic thin film 2a. This is because the synthetic resistance value of the metallic thin films 2a and 2b is minimized when making the width W2 of the metallic thin film 2b almost equal to the width of the metallic thin film 2a. Moreover, the width W1 between the metallic thin films 2a and 2b is set to a value at which the insulation between the metallic thin films 2a and 2b can be secured.

Bonding portions of the above wires 5 are linearly arranged in the longitudinal direction of the semiconductor laser element 3 as shown in FIG. 1. However, it is also allowed to uniformly disperse the bonding portions. In this case, it is allowed to use positions shifted from the position of the active layer 3a of the semiconductor laser element 3 as bonding portions. In short, it is an objective for the currents to be uniformly distributed on the upper face of the semiconductor laser element 3 through the wires 5. Thus, as an alternative to the wires 5, a conductive film or foil could be used.

The resistance of the thermistor 4 is detected by joining the bottom face of the thermistor 4 to the metallic thin film 2c and joining the upper face of the thermistor 4 to the metallic thin film 2d by a wire as illustrated and the temperature is detected by the resistance value. The thermistor 4 is set nearby the end face 3a from which a laser beam of the semiconductor laser element 3 is emitted. The end face 3a of the semiconductor laser element 3 is made almost flush with an end face of the carrier 1 so that other member does not interfere with a laser beam, otherwise the heat generated nearby the end face 3a of the semiconductor laser element 3 increases.

The carrier 1 functions as a heat sink for the semiconductor laser element 3, the whole bottom face of the carrier 1 is joined to a CuW base 27 (FIG. 13) by AuSn solder 6, and the base 27 is joined to a Peltier module 28 (FIG. 13) for controlling the temperature of the semiconductor laser element 3. The Peltier module 28 prevents the semiconductor laser element 3 from being thermally saturated and the optical output and service life of the semiconductor laser element from deteriorating by mainly performing cooling correspondingly to the temperature detected by the thermistor 14 and controlling the temperature of the semiconductor laser element 3.

Figure 15:
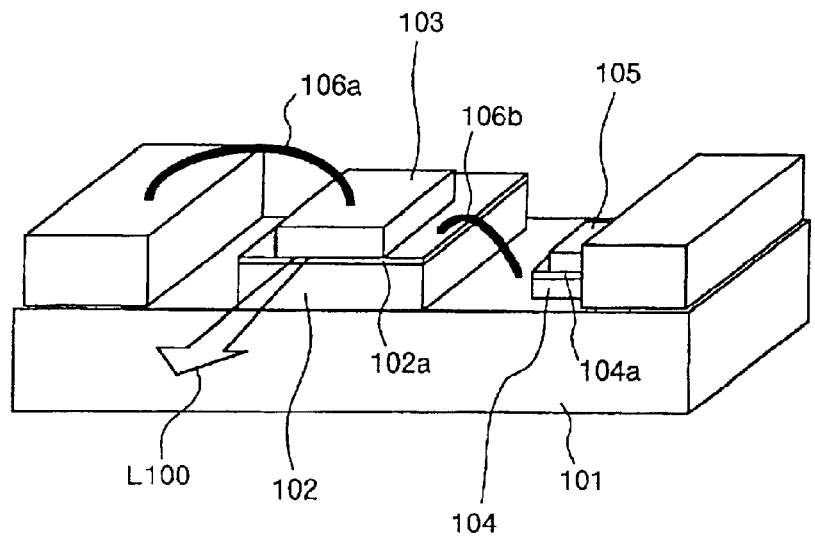
FIG. 15 shows a configuration of a conventional semiconductor laser device.

In the case of the semiconductor laser device of the first embodiment, the submount 102 shown in FIG. 15 (a conventional device) is not set between the semiconductor laser element 3 and the carrier 1 or the insulating submount 104 shown in FIG. 15 is not set between the thermistor 4 and the carrier 1. Thus, the heat conducting path between the semiconductor laser element 3 and the thermistor 4 is decreased in length at least by the thicknesses of the submounts 102 and 104 compared to the case of the conventional semiconductor laser device shown in FIG. 15. Thereby, the thermistor 4 can quickly detect the temperature of the semiconductor laser element 3 compared to the conventional case, and temperature control could be performed more rapidly.

Moreover, because the submounts 102 and 104 are excluded, two junction faces corresponding to the metallic thin films 2b and 2c are present on the heat conducting path between the semiconductor laser element 3 and the thermistor 4 the above number of junction faces is smaller than the number of junction faces (four faces) present in the conventional semiconductor laser device shown in FIG. 15. That is, in the case of the semiconductor laser device shown in FIG. 1, the heat loss is reduced at least by a value equivalent to the reduced number of junction faces compared to the conventional case and the thermistor 4 can detect a temperature closer to the actual temperature of the semiconductor laser element 3.

Figure 16:
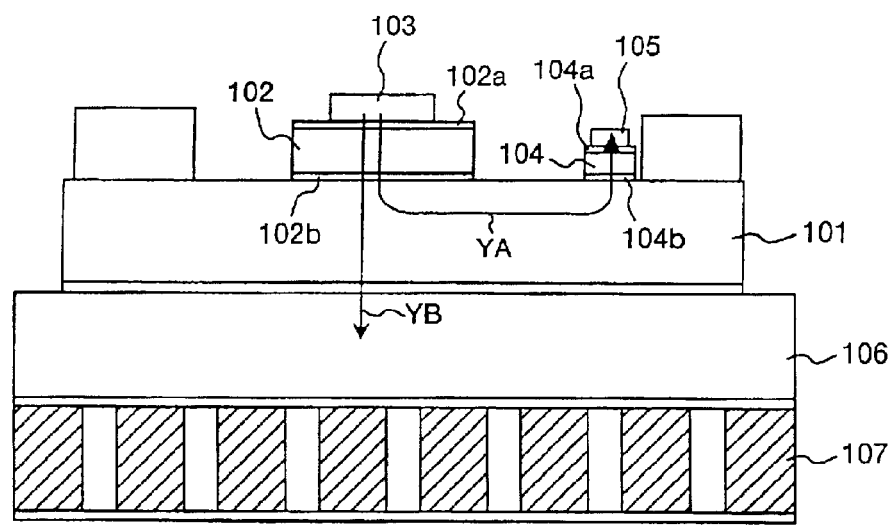
FIG. 16 is a front view of the semiconductor laser device shown in FIG. 15.

Moreover, because the submount 102 is excluded, the total of three junction faces such as two junction faces corresponding to the metallic thin film 2b, the junction face between the carrier 1 and the above base 27, and the junction face between the base 27 and the Peltier module 28 are present on the heat conducting path between the semiconductor laser element 3 and the Peltier module 28. This number is smaller than the case of the conventional semiconductor laser device described for FIG. 16 by one face.

That is, it is possible to perform the temperature control of the semiconductor laser element 3 by the Peltier module 28 more quickly and accurately than ever in the conventional device of FIG. 15.

For example, FIG. 2 is a graph which shows the relation of the temperature difference between the semiconductor laser element 3 and the thermistor 4 to the heat generated by the semiconductor laser element 3. In FIG. 2, values shown by a symbol "□" show the relation of the temperature difference between the semiconductor laser element 3 and the thermistor 4. Values shown by a symbol "Δ" show the relation of the temperature difference between the semiconductor laser element 3 and the thermistor 4 in the conventional semiconductor laser device having submounts 102 and 104 formed by AlN as shown in FIG. 15.

As shown in FIG. 2, it is found that a structure in which the semiconductor laser element 3 and thermistor 4 are set on the carrier 1 has a smaller temperature difference and the difference increases as a calorific value increases. For example, when an element calorific value is 1.0 [W], the configuration of the first embodiment and the configuration of the conventional example shown in FIG. 15 have almost the same temperature difference of 7° C. However, when the element calorific value is 3.5 [W], the temperature difference is 22.5° C. in the case of the first embodiment and 25° C. in the case of the conventional example and thus, a difference of 2.5° C. occurs. Therefore, when a semiconductor laser element for outputting a high output laser beam of 250 W or more is mounted, it is possible to detect a temperature closer to the temperature of the semiconductor laser element 3 and perform more accurate temperature control by using the structure of the semiconductor laser device shown in FIG. 1. As a result, it is possible to always control the semiconductor laser element 3 in a predetermined temperature range and prevent the optical output and service life of the semiconductor laser element 3 from deteriorating.

FIG. 3 is a graph which shows relations between injection current and output power of the semiconductor laser element 3 of the first embodiment and a conventional semiconductor laser element. In FIG. 3, the continuous line A shows the characteristic of the semiconductor laser element 3 of this first embodiment and the broken line shows the characteristic of the semiconductor laser element 103 of the conventional semiconductor laser device shown in FIG. 15. As shown in FIG. 3, the rate of the output power increased in accordance with the increase of injection current in the case of the semiconductor laser element 3 of this first embodiment is larger than the case of the conventional semiconductor laser element 103. Particularly, a difference is not found between output powers between the two up to approximately 200 mA of injection current. However, at approximately 1,500 mA of injection current, the output power of the conventional semiconductor laser element 103 is approximately 360 mW while the output power of the semiconductor laser element 3 of this first embodiment rises up to approximately 410 mW.

The above result that output power increases at the same injection current the corroborates result shown in FIG. 2, that is, the result that the thermistor 4 of the first embodiment can detect the temperature of the semiconductor laser element 3 more accurately than with the conventional device. In other words, because the above Peltier module 28 performs temperature control such as cooling in accordance with a temperature measurement result of the thermistor 4, when the temperature measurement result is accurate, it is possible to completely cool the semiconductor laser element 3 and finally increase the output power of the semiconductor laser element 3.

Figure 4A:
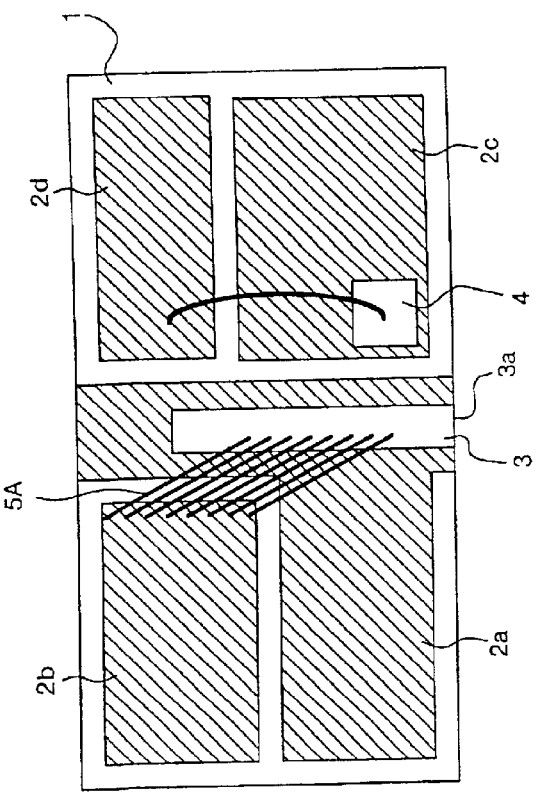
FIGS. 4A to 4C show a configuration of a semiconductor laser device that is a first modification of the first embodiment of the present invention.
Figure 4B:
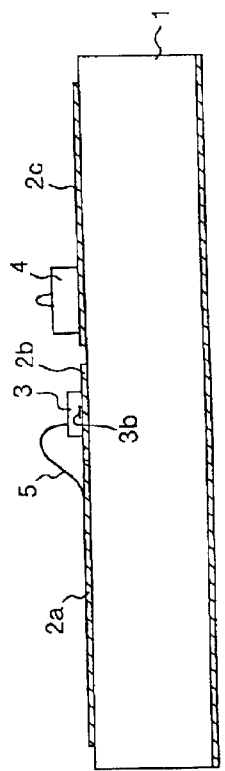
Figure 4C:
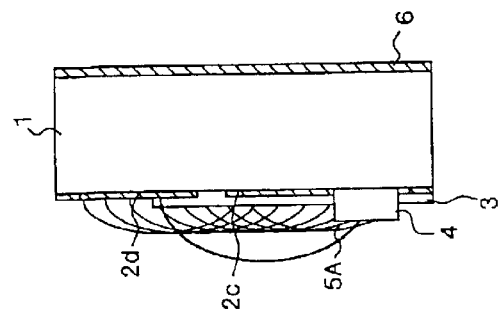

The structure of the semiconductor laser device of this first embodiment uses the metallic thin film 2a as the conductor pattern of the n-side electrode in order to shorten wirings of the wires 5 in the above description. However, it is also allowed to use the metallic thin film 2a as the conductor pattern of the p-side electrode and the metallic thin film 2b as the conductor pattern of the n-side electrode. That is, as shown in FIG. 4, an alternative is to use metallic thin film 2a as the conductor pattern of the p-side electrode, set the lead portion to the emission side of the semiconductor laser element 3, and use the metallic thin film 2b as the conductor pattern of the n-side electrode so as to be connected with the n-side electrode of the semiconductor laser element 3 by a wire 5A.

Moreover, as shown in FIG. 5, through use of conductor rods 1a embedded in the carrier 1 it is possible to eliminate the lead portion of the conductor pattern of the p-side electrode of the semiconductor laser element 3, to connect the metallic thin film 2b with a metallic thin film at the back of the carrier 1 and to supply power from the bottom side of the semiconductor laser device. Also in this case, the Au film thickness of the metallic thin film 2b is set to 5,000 μm or more so that a voltage drop due to a resistance decreases. Moreover, a plurality of conductor rods 1a are set to the metallic thin film 2b so that the non-uniformity of voltage drops does not occur in the resonator length direction of the semiconductor laser element 3.

As described above, with the first embodiment it is possible to prevent the optical output and service life from deteriorating even for the high output semiconductor laser element 3 because of setting the semiconductor laser element 3 and the thermistor 4 on the same carrier 1 having an insulating characteristic and a high heat conductivity, decreasing the heat conducting distance so that the thermistor 4 more quickly and accurately detects the temperature of the semiconductor laser element 3, and increasing the Au film thickness of the metallic thin film 2b formed between the semiconductor laser element 3 and the carrier 1 so as to decrease the resistance and eliminate the non-uniformity of injection currents in the resonator length direction.

Moreover, in the case of the first embodiment, Au film thicknesses of the metallic thin films 2a to 2d, particularly Au film thicknesses of the metallic thin films 2a and 2b are increased and the semiconductor laser element 3 and the metallic thin film 2a are connected by a plurality of wires 5. Therefore, the resistance up to the p-side and n-side electrodes of the semiconductor laser element 3 is reduced and it is possible to suppress the calorific value of the semiconductor laser device and improve the power heat conversion efficiency.

By increasing Au film thicknesses of the metallic thin films 2a to 2d and using the structure having a plurality of wiring by the wires 5, it is possible to increase the size of the carrier 1 functioning as a heat sink. That is, in the case of a semiconductor laser device having the high output semiconductor laser element 3, it is necessary to increase the size of a heat sink for radiating heat. However, even when the size of the heat sink is increased, it is possible to efficiently perform the function of the semiconductor laser element 3, that is, oscillation of a high output and stable laser beam.

The second embodiment of the present invention is described below. In the case of the above first embodiment, the semiconductor laser element 3 and thermistor 4 are set on the same carrier 1 formed by AlN. In the case of the second embodiment, however, a semiconductor laser element 3 and a thermistor 4 are set on a submount formed by a material, such as diamond, having a heat conductivity five times larger than that of AlN.

FIG. 6A is a top view, FIG. 6B is a front view, and FIG. 6C is a right side view of the semiconductor laser device of the second embodiment of the present invention. In FIGS. 6A to 6C, a carrier 13 is formed by AlN having an insulating characteristic and a high heat conductivity and a diamond submount 11 is set on the center of the upper portion through a metallic thin film 12. Configurations of the semiconductor laser element 3, thermistor 4, a wire 5, and metallic thin films 2a to 2d are the same as the case of the first embodiment and the same component is provided with the same symbol.

Metallic thin films 12a to 12d corresponding to patterns of the metallic thin films 2a to 2d are formed on portions other than the area in which the diamond submount 11 is set on the carrier 13. These metallic thin films 12a to 12d are respectively formed by an Au film. That is, the metallic thin films 2a to 2d and the metallic thin films 12a to 12d are respectively bonded by the illustrated wire and each pair realizes a configuration corresponding to each of the metallic thin films 2a to 2d shown in FIG. 1.

In the case of the second embodiment, the carrier 1 shown for the first embodiment is realized by combining the diamond submount 11 with the carrier 13. However, the total height (thickness) of the diamond submount 11 and the carrier 13 is the same as the height of the carrier 1 of the first embodiment. Thereby, it is possible to make positions of laser beams emitted from the semiconductor laser element 3 the same. Because the carrier 13 is bonded on a CuW base 27 (FIG. 13) in the case of the second embodiment, the AlN carrier 13 is held by the diamond submount 11 and base 27 in order to moderate the strain between the submount 11 and the base 27.

Figure 7A:
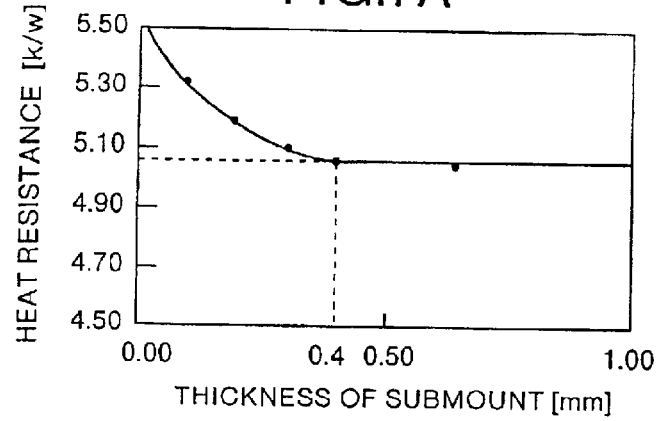
FIGS. 7A to 7C are graphs which show the experiment data showing the relation between the size and the heat resistance of a diamond submount of the semiconductor laser device which is the second embodiment of the present invention.
Figure 7B:
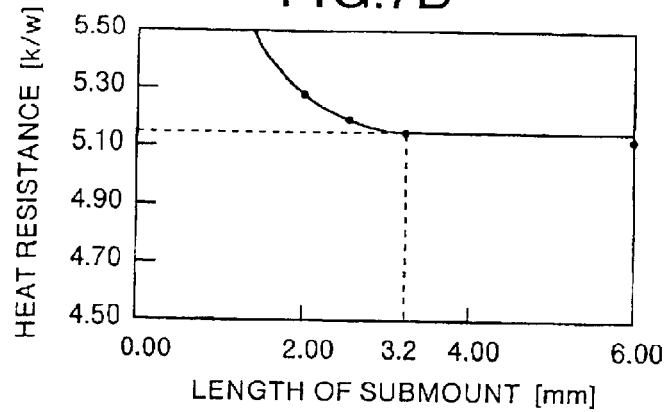
Figure 7C:
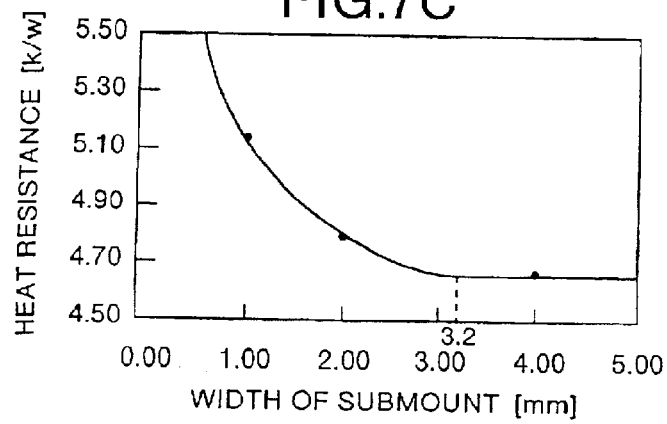

Sizes of diamond for realizing effective radiation are described below. FIGS. 7A to 7C are graphs which show experiment data showing relations between sizes and heat resistances of the diamond submount 11. FIG. 7A is a graph which shows the relation between thicknesses and heat resistances when fixing the length of the diamond submount 11 to 2.5 mm and the width of the diamond submount to 1.0 mm. FIG. 7B is a graph which shows the relation between thicknesses and heat resistances when fixing the thickness of the diamond submount 11 to 0.2 mm and the width of it to 1.0 mm. FIG. 7C is a graph which shows the relation between widths and heat resistances when fixing the length of the diamond submount 11 to 2.5 mm and the width of it to 0.2 mm. From every graph, it is found that a heat resistance converges to a certain minimum value as a size increases. Therefore, it is possible to estimate an optimum size of the submount at which a heat resistance is minimized.

Figure 8:
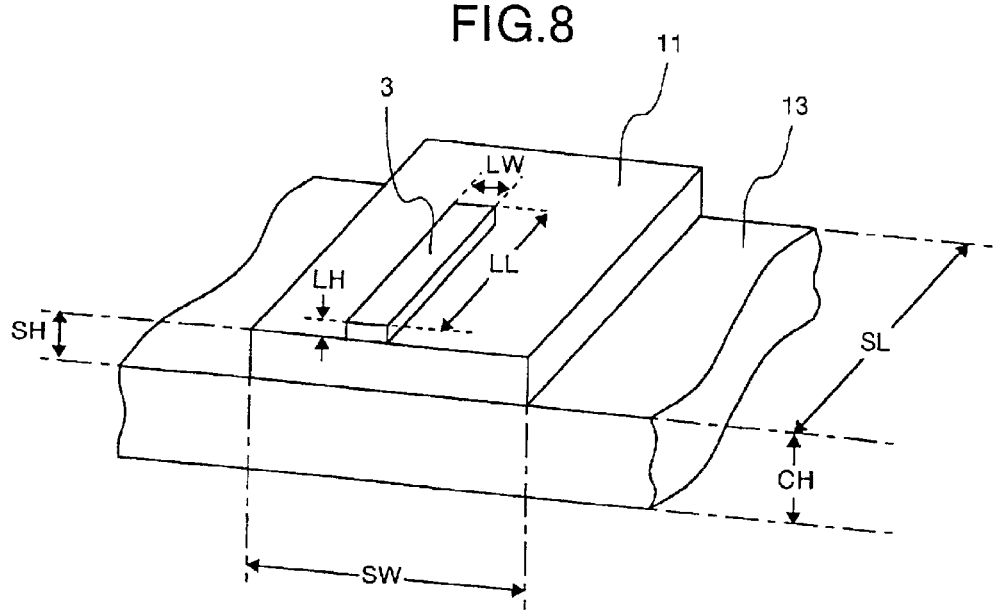
FIG. 8 is a perspective view explaining an optimum size of the diamond submount of the semiconductor laser device that is the second embodiment of the present invention.

FIG. 8 is a perspective view for explaining an optimum size of the diamond submount 11. As a result of estimating a size at which a heat resistance becomes smaller in accordance with the experiment data shown in FIG. 7 and the cost, the present inventor finds that it is preferable to form a diamond submount 11 at a thickness SH of 0.4 mm, a length SL of 3.2 mm, and a width SW of 3.2 mm. The above experiment data is a result of setting the thickness LH of the semiconductor laser element 3 to 0.13 mm, the length LL of it to 2.0 mm, and the width LW of it to 0.35 mm. For the size of the diamond submount 11, it is also possible to set the thickness SH to 0.3 mm, the length SL to 2.7 mm, and the width SW to 1.0 mm and use a structure suppressing a heat resistance within a value 1.2 times larger than the above minimum heat resistance.

Thus, a shape of the diamond submount 11 including its thickness is decided so that the heat resistance decreases. Moreover, the diamond submount 11 uses polycrystal diamond synthesized through chemical vapor deposition (CVD). Diamond is a material having a highest heat conductivity, which can further improve the radiation effect of the semiconductor laser element 3.

The whole bottom face of the carrier 13 is joined to the CuW base 27 by AuSn solder 6 and moreover, the base 27 is joined to a Peltier module 28 (FIG. 13) for controlling the temperature of the semiconductor laser element 3. The Peltier module 28 mainly performs cooling in accordance with the temperature detected by the thermistor 4, prevents the semiconductor laser element 3 from being thermally saturated by controlling the temperature of the semiconductor laser element 3, and prevents the optical output and the service life of the semiconductor laser element 3 from deteriorating.

In this case, by setting thicknesses of Au films of the metallic thin films 2a to 2d to 5,000 nm or more, resistances of the metallic thin films 2a to 2d are decreased, voltage drops are decreased, and a power light conversion efficiency is improved. Moreover, when a large current is injected into the p-side electrode of the semiconductor laser element 3, it is possible to reduce the non-uniformity of voltage drops in the resonator length direction of the semiconductor laser element 3 and resultantly prevent the optical output and service life of the semiconductor laser element 3 from deteriorating.

Because the semiconductor laser element 3 and thermistor 4 are set on a common diamond submount 11, the heat conducting path between the semiconductor laser element 3 and the thermistor 4 is shortened similar to the case of the first embodiment. Thereby, the thermistor 4 can detect the temperature of the semiconductor laser element 3 more quickly than in the first embodiment.

As with the first embodiment, the fact that heat resistance is reduced because of reduction of the number of junction faces, the thermistor 4 can detect a temperature closer to the actual temperature of the semiconductor laser element 3. Also, it is still possible to perform the temperature control of the semiconductor laser element 3 by the Peltier module 28 (FIG. 13) more quickly and accurately than the conventional semiconductor laser device shown in FIG. 15 because the diamond submount 11 has a heat conductivity higher than that of AlN which is the material of a submount 102 (FIG. 15) in a conventional semiconductor laser device. Moreover, by using the diamond submount 11, it is possible to quickly diffuse the heat generated in the semiconductor laser element 3 particularly in a wide range including the transverse direction and improve the radiation effect compared to the case of a conventional AlN submount. That is, it is possible to suppress a temperature rise to an injection current compared to the case of a semiconductor laser element set to a conventional semiconductor laser device and realize a high output semiconductor laser device by resultantly converting the value equivalent to the reduction of the temperature rise into output power.

As described above, with the second embodiment it is possible to prevent the optical output and service life from deteriorating even for the high output semiconductor laser element 3. This is due to setting the semiconductor laser element 3 and thermistor 4 on the same diamond mount 11 having an insulating characteristic and a high heat conductivity and decreasing the heat conducting distance. With this configuration, the thermistor 4 more quickly and accurately detects the temperature of the semiconductor laser element 3, the resistance is decreased by increasing the Au-film thickness of the metallic thin film 2b formed between the semiconductor laser element 3 and the diamond submount 11, and the non-uniformity of current injection in the resonator length direction is eliminated.

In the case of the above first and second embodiments, the semiconductor laser element 3 and thermistor 4 are set on the same substrate of the AlN carrier 1 or diamond submount 11. However, it is also allowed to use other material for the carrier, such as Si or cubic boron nitride (cBN) polycrystal, having an insulating characteristic and a high heat conductivity in accordance with the thermal expansion coefficient of the semiconductor laser element 3.

The third embodiment of the present invention is described below. In the case of the above first and second embodiments, the semiconductor laser element 3 and thermistor 4 are set on a common carrier 1 or diamond submount 11. In the case of this third embodiment, however, an optical monitor for monitoring a laser beam output from the semiconductor laser element 3 is further set on the same carrier 1 or diamond submount 11.

Figures 9A, 9C:
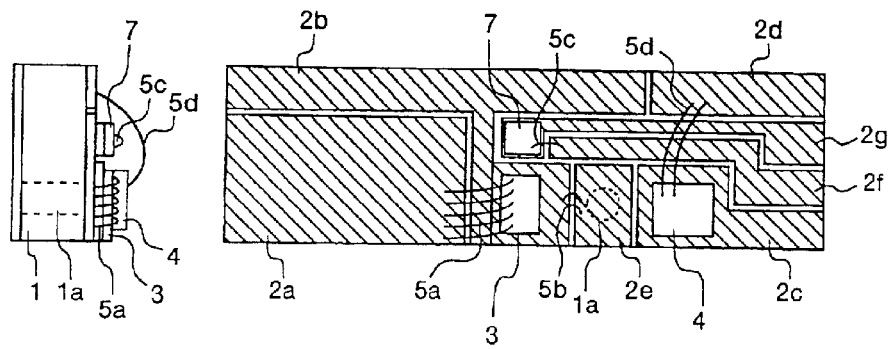
FIGS. 9A and 9B show a configuration of a semiconductor laser device that is third embodiment of the present invention.
Figure 9B:
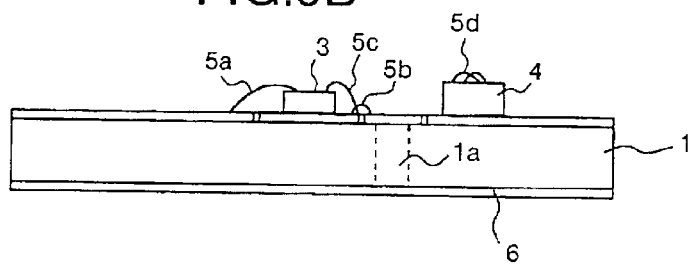

FIG. 9A is a top view, FIG. 9B is a front view, and FIG. 9C is a left side view of the semiconductor laser device of the third embodiment of the present invention. In FIGS. 9A to 9C, the semiconductor laser device has a semiconductor laser element 3 and a thermistor 4 on a carrier 1 formed by AlN having an insulating characteristic and a high heat conductivity and moreover includes an optical monitor 7 for monitoring a laser beam radiated from the rear side of the semiconductor laser element 3. The optical monitor 7 is realized by a photodiode.

Figure 13:
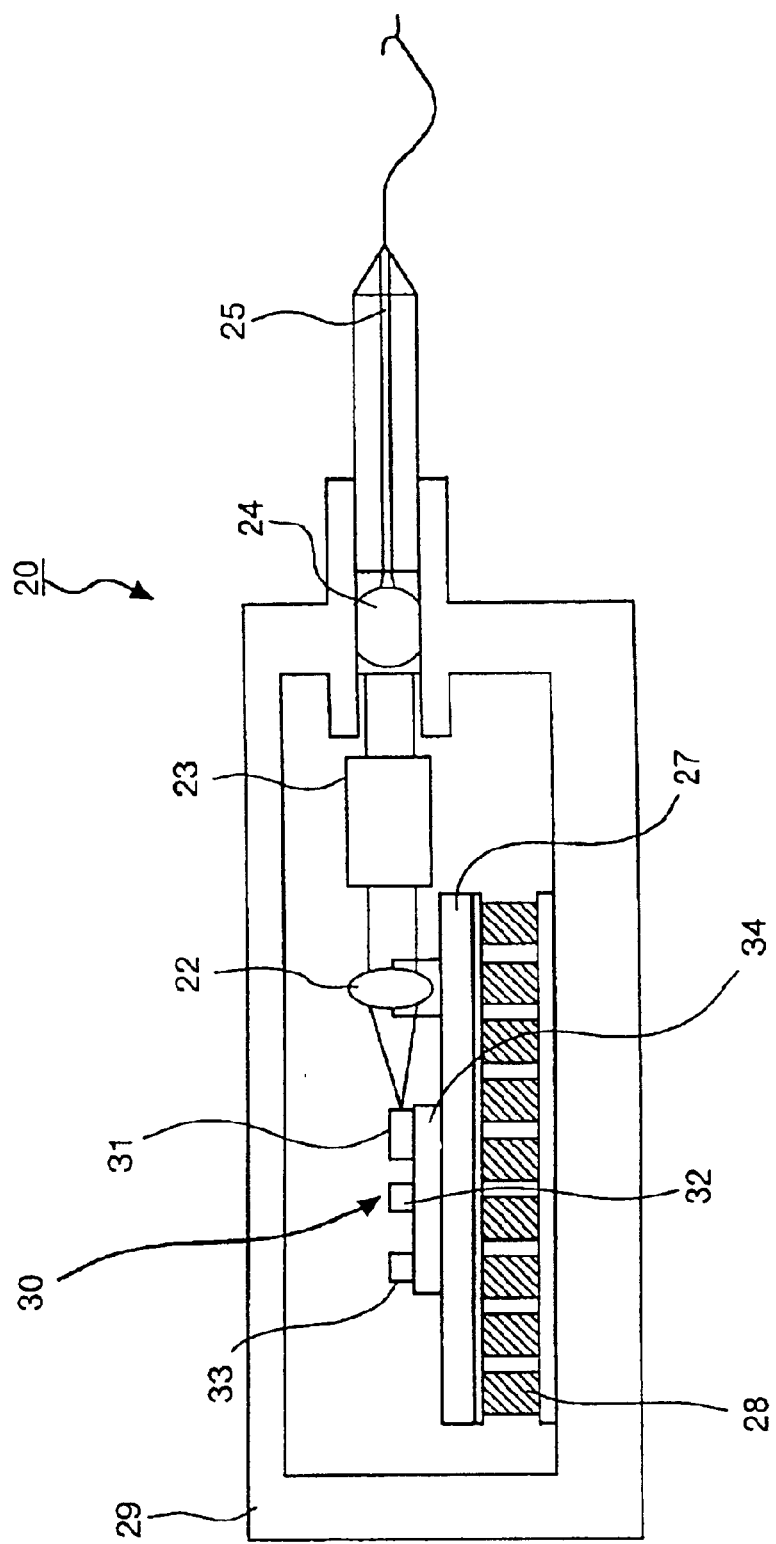
FIG. 13 is a sectional view which shows a configuration of a semiconductor laser module that is fifth embodiment of the present invention.

In FIGS. 9A to 9C, the carrier 1 is provided with a conductor rod 1a to connect a metallic thin film 2e at the upper portion with AuSn solder 6 at the lower portion by a low resistance. The n-side electrode of the semiconductor laser element 3 is connected to a metallic thin film 2a by a wire 5a while the p-side electrode of the semiconductor laser element 3 is electrically joined with metallic thin films 2b and 2e by a wire 5b and moreover connected to the AuSn solder 6 through the conductor rod 1a and a base 27 (FIG. 13).

One electrode of the thermistor 4 is connected to a metallic thin film 2d through a wire 5d and the other electrode is connected to a metallic thin film 2c. One electrode of the optical monitor 7 is connected to a metallic thin film 2f through a wire 5c and the other electrode of it is connected to a metallic thin film 2g. The metallic thin films 2a to 2g are electrically insulated from each other. The metallic thin films 2a to 2g are respectively formed by three layers of Ti, Pt, and Au and have thicknesses of 60, 200, and 5,000 nm.

The bottom face of the carrier 1 is joined to a CuW base 27 by the AuSn solder 6 and the base 27 is joined to a Peltier module 28 (FIG. 13) for controlling the temperature of the semiconductor laser element 3. The Peltier module 28 mainly operates in accordance with the temperature detected by the thermistor 4 and prevents the semiconductor laser element 3 from being thermally saturated and the optical output and service life of the semiconductor laser element 3 from deteriorating by controlling the temperature of the semiconductor laser element 3.

In this case, by setting the thickness of the Au film of the metallic thin film 2b to 5,000 nm or more, the resistance of the metallic thin film 2b decreases, the voltage drop decreases, and when a large current is injected into the semiconductor laser element 3, it is possible to decrease the non-uniformity of voltage drops in the resonator length direction of the semiconductor laser element 3 and resultantly, the optical output is prevented from deteriorating.

In the third embodiment, the length of the heat conducting path between the semiconductor laser element 3 and thermistor 4 decreases similarly to the case of the first embodiment because the semiconductor laser element 3 and thermistor 4 are set on the carrier 1 without using the submounts 102 and 104 shown in FIG. 15. Thereby, the thermistor 4 can quickly detect the temperature of the semiconductor laser element 3 compared to a conventional thermistor. Moreover, decrease of heat loss due to decrease of the number of junction faces, that is, the fact that the thermistor 4 can detect a temperature closer to the actual temperature of the semiconductor laser element 3 is the same as the case of the first embodiment.

An advantage of the third embodiment is that it is possible to downsize the semiconductor laser device by setting the optical monitor on the same carrier 1.

As described above, with the third embodiment it is possible to prevent the optical output from deteriorating even for the high output semiconductor laser element 3 and accelerate downsizing of a semiconductor laser device provided with an optical monitor because the semiconductor laser element 3 and thermistor 4 are set on the same carrier 1 having an insulating characteristic and a high heat conductivity, the optical monitor 7 is further set, the heat conducting distance is decreased, the thermistor 4 more quickly and accurately detects the temperature of the semiconductor laser element 3, and the thickness of the Au film of the metallic thin film 2b formed between the semiconductor laser element 3 and carrier 1 is increased so as to decrease the resistance and eliminate the non-uniformity of current injection in the resonator length direction.

The fourth embodiment of the present invention is described below. In the case of the conventional semiconductor laser device shown in FIG. 15, an AlN submount on which a semiconductor laser element is mounted and an AlN submount on which a thermistor is mounted are set on the same carrier. In the case of the fourth embodiment, however, the thermistor submount is excluded by directly mounting a thermistor on a carrier similar to the first embodiment and a semiconductor laser element is set on a diamond submount similar to the second embodiment.

FIG. 10A is a top view, FIG. 10B is a front view, and FIG. 10C is a right side view of the fourth embodiment of the present invention. In FIGS. 10A to 10C, a carrier 1 is formed by AlN having a high insulating characteristic and a high heat conductivity. As shown in FIGS. 10A to 10C, metallic thin films 2a to 2d are patterned and formed on the carrier 1 so as to be insulated from each other. The metallic thin films 2a to 2d are formed as a structure in which Ti, Pt, and Au are layered in order from the carrier-1 side and the layers have thicknesses of 60, 200, and 5,000 nm.

A diamond submount 2 formed by polycrystal diamond is set on the carrier 1 through the metallic thin film 2b. A semiconductor laser element 3 is set on the diamond submount 2 through a metallic thin film 2h similarly to the above metallic thin film. The diamond submount 2 secures the insulation of the semiconductor laser element 3 and functions as a heat sink of the semiconductor laser element 3.

The p-side electrode at the active layer side of the semiconductor laser element 3 is joined so as to face the diamond submount 2 and the n-side electrode is the upper face. The n-side electrode of the semiconductor laser element 3 is electrically connected with the metallic thin film 2a by Au wires 5. The p-side electrode and metallic thin film 2b of the semiconductor laser element 3 are electrically connected to each other through a metallic thin film 2h and an illustrated wire. Therefore, the metallic thin film 2a serves as the negative electrode of the semiconductor laser element 3 and the metallic thin film 2b serves as the positive electrode of the semiconductor laser element 3.

The wires 5 for electrically connecting the n-side electrode with the metallic thin film 2a of the semiconductor laser element 3 are constituted by a plurality of wires so as to increase the current carrying area. Thus, the resistance value generated at a wiring portion decreases and it is possible to reduce the voltage drop at the portion. Reduction of the voltage drop contributes to suppression of heat generation and increase of a power ratio only used for a laser beam output and resultantly improves a power light conversion efficiency. Moreover, by making intervals between connection points of the wires 5 almost equal, it is possible to realize power dispersion. Thereby, it is possible to reduce the non-uniformity of voltage drops and resultantly prevent the optical output and service life of the semiconductor laser element 3 from deteriorating.

Bonding portions of the above wires 5 are linearly arranged in the longitudinal direction of the semiconductor laser element 3 as shown in FIG. 10A. However, it is also allowed to uniformly disperse the bonding portions on the surface of the n-side electrode of the semiconductor laser element 3. In this case, it is also possible to set the bonding portions to positions shifted from the position of the active layer of the semiconductor laser element 3. In short, it is preferable that currents are uniformly distributed on the upper face of the semiconductor laser element 3 through the wires 5.

As shown in FIGS. 10A to 10C, a thermistor 4 for measuring the temperature of the semiconductor laser element 3 is set on the carrier 1 through the metallic thin film 2c. The lower face of the thermistor 4 serving as one electrode is joined to the metallic thin film 2c and the upper face of it serving as the other electrode is electrically connected with the metallic thin film 2d through the illustrated wire.

By setting the high output semiconductor laser element 3 so that the end face 3a of the semiconductor laser element 3 becomes almost flush with the end face of the carrier 1, it is possible to reduce the interference of a laser beam generated with other member. However, the vicinity of the end face 3a of the semiconductor laser element 3 cannot greatly receive the radiation effect by the submount 2 and therefore, the vicinity easily has a high temperature compared to other portion of the semiconductor laser element 3. Therefore, it is particularly preferable to set the thermistor 4 nearby the end face 3a from which a laser beam of the semiconductor laser element 3 is emitted.

Since the submount 104 shown in FIG. 15 is not used, the length of the heat conducting path between the semiconductor laser element 3 and the thermistor 4 is decreased by at least the thickness of the excluded submount 104 compared to the case of the conventional semiconductor laser device shown in FIG. 15. Thereby, the thermistor 4 can detect the temperature of the semiconductor laser element 3 more quickly than ever.

In addition, because the submount 104 is excluded, the number of junction faces (three) corresponding to the metallic thin films 2b, 2c, and 2h present on the heat conducting path between the semiconductor laser element 3 and the thermistor 4 is smaller than the number of junction faces (four) present in the conventional semiconductor laser device shown in FIG. 15. Thus, in the case of the semiconductor laser device shown in FIG. 10, the heat resistance decreases by at least a value equivalent to reduction of the number of junction faces compared to a conventional case and the thermistor 4 can detect a temperature closer to the actual temperature of the semiconductor laser element 3.

It is possible to control the temperature of the semiconductor laser element 3 by the Peltier module 28 (FIG. 13) more quickly and accurately than in the conventional case because the diamond submount 2 has a heat conductivity higher than that of AlN which is the material of the conventional submount 102 shown in FIG. 15. Moreover, by using the diamond submount 2, it is possible to quickly diffuse the heat generated in the semiconductor laser element 3 particularly in a wide range including the transverse direction and improve the radiation effect compared to the case of a conventional AlN submount. That is, it is possible to suppress a temperature rise to an injection current compared to the case of a semiconductor laser element set to a conventional semiconductor laser device and realize a high output semiconductor laser device.

Figure 11:
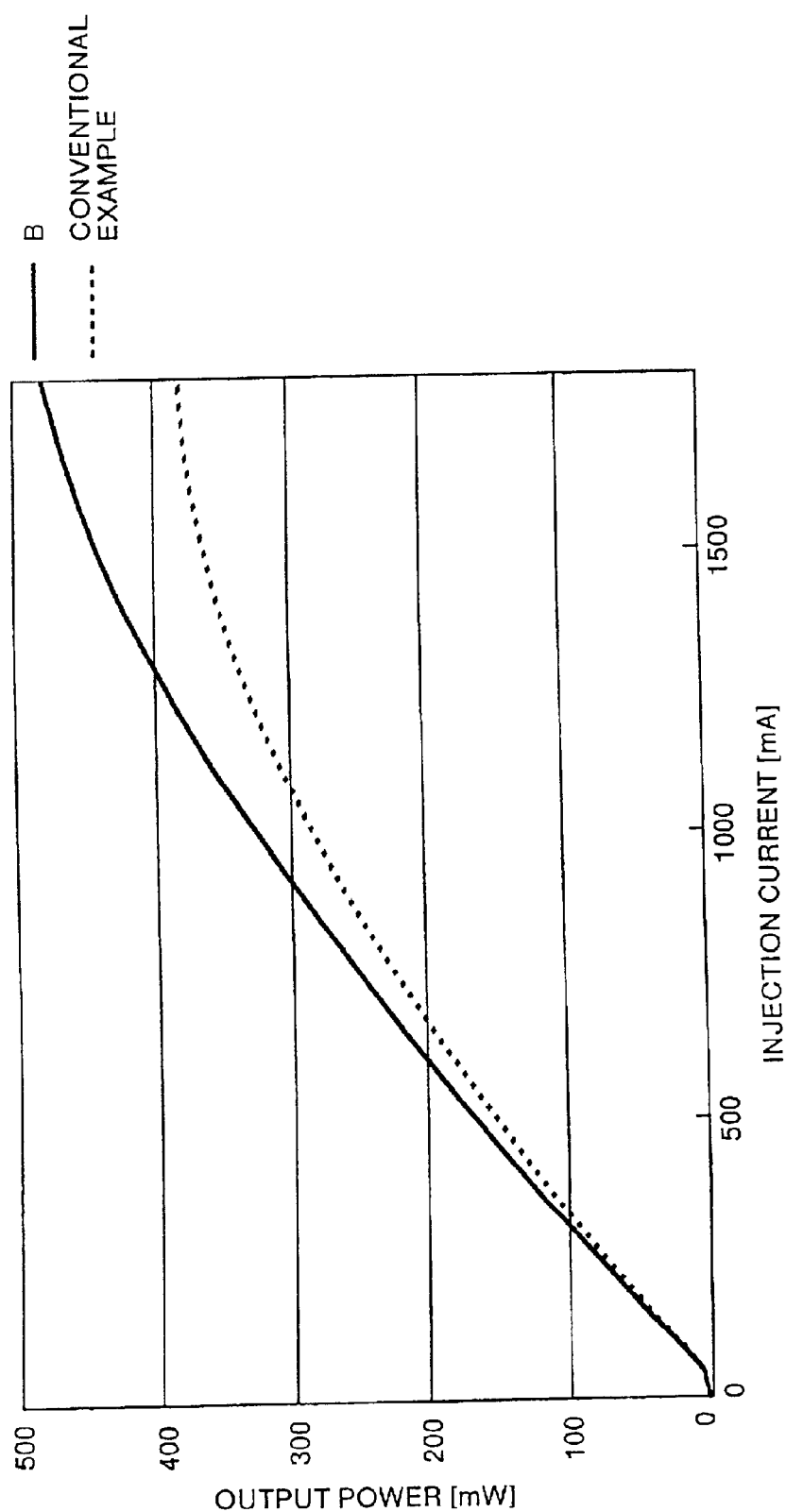
FIG. 11 shows relations between injection currents and output powers of a semiconductor laser element of the fourth embodiment of the present invention and a conventional semiconductor laser element.

FIG. 11 is a graph which shows relations between injection currents and output powers of the semiconductor laser element 3 of this fourth embodiment and a conventional semiconductor laser element. In FIG. 11, the continuous line B shows the characteristic of the semiconductor laser element 3 of this fourth embodiment and the broken line shows the characteristic of the semiconductor laser element 103 of the conventional semiconductor laser device shown in FIG. 15. As shown in FIG. 11, the rate of the output power increasing in accordance with increase of an injection current of the semiconductor laser element 3 of this fourth embodiment is larger than that of the conventional semiconductor laser element 103. Particularly, though a difference is not observed between output powers of the both up to an injection current of approximately 200 mA, the output power of the semiconductor laser element 3 of this fourth embodiment rises up to approximately 440 mW while the output power of the conventional semiconductor laser element 103 is approximately 360 mW at an injection current of approximately 1,500 mA.

The above result that output power increases at the same injection current is caused by the improvement of a power light conversion efficiency due to the above high radiation effect in addition to the fact of controlling the temperature of the semiconductor laser element 3 to a desired value in accordance with a temperature measurement result by the thermistor 4 as described for the first embodiment.

As described above, the structure shown in FIG. 10 makes it possible to carry a current to the p-side electrode of the semiconductor laser element 3 by connecting the metallic thin film 2h on the diamond mount 2 with the metallic thin film 2b on the carrier 1 through a wire. However, it is also possible to form a metallic thin film also on the side face of the diamond submount 2 and provide the function of the wire 5 for the metallic thin film on the side face. The thin film that covers the diamond mount includes Au thin film.

FIG. 12A is a top view, FIG. 12B is a front view, and FIG. 12C is a right side view of another configuration of the fourth embodiment of the present invention. In FIGS. 12A to 12C, a portion common to that in FIG. 10 is provided with the same symbol and its description is omitted.

FIGS. 12A to 12C are different from FIGS. 10A to 10C in that the upper face and side face of the diamond submount 2 are covered with a metallic thin film 2i and wires for connecting the metallic thin films 2h and 2b shown in FIG. 10 each other are excluded. The metallic thin film 2f electrically contacts the p-side electrode of the semiconductor laser element 3 located on the upper face of the diamond submount 2 and the metallic thin film 2b on the carrier 1 to electrically connect the electrode with the metallic thin film 2b.

As described above, the fourth embodiment has all the advantages of the second embodiment. In addition, because the thermistor 4 is set on the carrier 1 without using a submount, production costs and complexity can be reduced compared to the second embodiment.

The fifth embodiment of the present invention is described below. The fifth embodiment uses the semiconductor laser device of any of the above embodiments within a module. FIG. 13 is a sectional view which shows a configuration of the semiconductor laser module that is the fifth embodiment of the present invention. In FIG. 13, the semiconductor laser module 20 has a semiconductor laser device 30 corresponding to the semiconductor laser device described for the above-described third embodiment. As a housing of the semiconductor laser module 20, a Peltier module 28 serving as a temperature controller is set on the inside bottom face of a package 29 made of a copper tungsten alloy or the like. A base 27 is set on the Peltier module 28 and a carrier 34 functioning as a heat sink is set on the base 27.

A semiconductor laser element 31, a thermistor 32, and an optical monitor 33 are arranged on the carrier 34 and the semiconductor laser device 30 corresponding to the semiconductor laser device described for the above third embodiment. Moreover, a first lens 22 is set on the base 27. A laser beam emitted from the semiconductor laser element 31 is guided to an optical fiber 25 through the first lens 22, an isolator 23, and a second lens 24. The second lens 24 is set onto the optical fiber 25 on the optical axis of the laser beam and optically coupled with the optical fiber 25 to be externally connected. The optical monitor 33 monitors and detects the light leaked from the reflection film side of the semiconductor laser element 31.

In the case of the semiconductor laser module 20, the isolator 23 is set between the semiconductor laser element 22 and the optical fiber 25 so that the return light reflected from other optical component does not reenter a resonator.

Though the fifth embodiment use a semiconductor laser module for directly outputting a laser beam output from the semiconductor laser element 31, it can be also applied to an optical fiber grating semiconductor laser module for wavelength selecting and outputting a laser beam output from the semiconductor laser element 31 by forming the optical fiber grating near by an end of the second lens 5 of the optical fiber 25. In this case, the isolator 23 is not used.

In the case of this fifth embodiment, because the semiconductor laser device uses a semiconductor laser module mounting a high output semiconductor laser element and constitutes a semiconductor laser device having the same configuration as the third embodiment, it is possible to quickly and accurately perform the temperature control of the semiconductor laser element and resultantly realize a semiconductor laser module reduced in size and weight. Moreover, even if the carrier 34 serving as a heat sink is increased in size in accordance with improvement of the semiconductor laser element 31 in output, it is possible to suppress the deterioration of a power light conversion efficiency.

Though the above fifth embodiment is formed into a module by using the semiconductor laser device described for the third embodiment, it is naturally possible to replace the semiconductor laser device 30 shown in FIG. 13 with the semiconductor laser device having the configuration described for each of the first, second and fourth embodiments.

Then, a result of comparing the output power of the conventional semiconductor laser device shown in FIG. 15 with the output power of each of the semiconductor laser devices described for the first and fourth embodiments is described below. is a graph which show the comparison between peak values of output powers of a conventional semiconductor laser device and the semiconductor laser device described for each of the first and fourth embodiments. On the abscissa axis shown in FIG. 14, A corresponds to the semiconductor laser device of the first embodiment (FIG. 1) and B corresponds to the semiconductor laser device of the fourth embodiment (FIG. 12).

Figure 14:
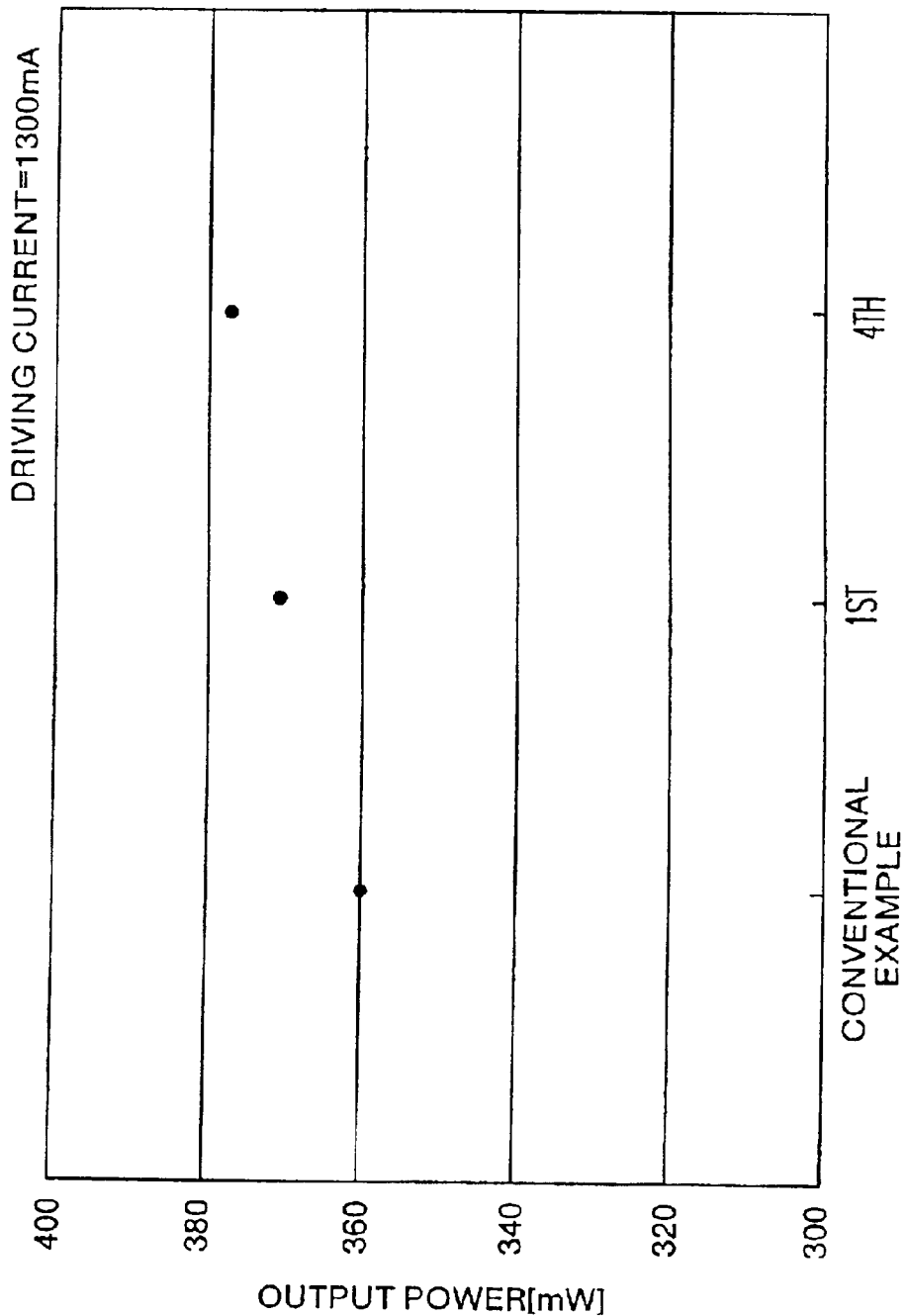
FIG. 14 is a graph which shows comparison between peak values of output powers of a conventional semiconductor laser device and the semiconductor laser device described for each of the first and fourth embodiments.

As shown in FIG. 14, an output power larger than that of the conventional semiconductor laser device is obtained from each of the semiconductor laser devices (A and B) shown for the first and fourth embodiments. Moreover, as a result of comparing output powers between the semiconductor laser devices shown for the first and fourth embodiments, a largest output power of approximately 377 mW is obtained from the semiconductor laser device (B) having a structure in which only the thermistor 4 is set on the carrier 1 and the semiconductor laser element 3 is set on the diamond submount 2 and then, an output power of approximately 370 mW is obtained from the semiconductor laser device (A) in which the semiconductor laser element 3 is set on the carrier 1.

From these results, it is found that the diamond submount 2 has a very large radiation effect because a large output power is obtained from a structure (B) constituted by adding the diamond submount 2 on which the semiconductor laser element 3 is set to a structure (A) having the shortest heat conducting path compared to the case of the structure (A).

In the case of the above first and fourth embodiments, a submount set immediately below the semiconductor laser element 3 is formed by diamond. However, it is preferable to actually use the diamond having a high heat conductivity of 1,000 to 1,300 W/(m·K). Moreover, it is possible to obtain the above advantage even if using a material {500 W/(m·K) or more} having a heat conductivity higher than that of AlN such as BN of 600 W/(m·K) or more other than diamond.

As described above, according to the first aspect of the invention, a semiconductor laser element for outputting a laser beam and a temperature measuring element for measuring the temperature of the semiconductor laser element are arranged on the same carrier having an advantageous insulating characteristic and a high heat conductivity and the semiconductor laser element and the temperature measuring element are joined to the carrier through a specially configured multi-layer film that includes a gold thin film so as to decrease the heat resistance of a heat conducting path including proximity arrangement. Therefore, advantages are obtained that the temperature measuring element can more accurately and quickly detects the temperature of the semiconductor laser element and prevent the optical output and service life of the semiconductor laser element from deteriorating. And because the carrier is formed by any one of Si, AlN, diamond, and cBN polycrystal, or a combination of them, an advantage is obtained that it is possible to flexibly select a material of the carrier.

According to the second and fourth aspects of the invention, a semiconductor laser element for outputting a laser beam is joined to a submount formed by a heat sink joined to a carrier and having a heat conductivity of 500 W/(m·K) or more through a multi-layer film including a gold thin film, and a temperature measuring element for measuring the temperature of the semiconductor laser element is joined, either via the same submount or directly, to the same carrier having an insulating characteristic and a high heat conductivity through a specially configured multi-layer film that includes a gold thin film so as to decrease the heat resistance of a heat conducting path including proximity arrangement. Therefore, advantages are obtained that the temperature measuring element can more accurately and quickly detect the temperature of the semiconductor laser element and prevent the optical output and service life of the semiconductor laser element from deteriorating. And because diamond has a high heat conductivity and it can be set on a lower layer of the semiconductor laser element to further accelerate the reduction of the heat resistance and the improvement of the radiation effect of a heat conducting path, thus advantages obtained include the fact that a temperature measuring element can more accurately and quickly detect the temperature of the semiconductor laser element and prevent the optical output and service life of the semiconductor laser element from deteriorating.

An advantage unique to the fourth aspect of the invention in the restriction of use of the submount to just semiconductor laser element is a reduction in production costs.

According to the third aspect of the invention, because a monitor element for monitoring the output of a laser beam output by a semiconductor laser element is also set on the carrier via a specially configured multi-layer film, an advantage is obtained that it is possible to further accelerate the decrease of a semiconductor laser device in size and weight. And because at least one of the semiconductor laser element, temperature measuring element, and monitor element is made electrically independent, an advantage is obtained that it is possible to further accelerate the decrease of a semiconductor laser device in size and weight.

In aspects one through four of the invention, because the semiconductor laser element and the temperature measuring element electrically join one electrode with the above conductor pattern by conductive wires and decrease lengths and the density of the wires, an advantage is obtained that it is possible to decrease the semiconductor laser device in size and weight. And because a plurality of the conductive wires are used, the conductive wires can be joined each other at almost equal intervals on the semiconductor laser element, and the temperature measuring element, and/or the above conductor pattern to uniform voltage drops to the semiconductor laser element and minimize voltage drops and heat generation due to the conductive wires, advantages are obtained that it is possible to prevent the optical output and service life of the semiconductor laser element from deteriorating, reduce the total heat generation of a semiconductor laser device, and improve the power light conversion efficiency of the semiconductor laser device.

Also in aspects one through four, the thickness of the gold thin film is set to 5 µm or more so that the heat resistance between a semiconductor laser element and a temperature measuring element decreases and moreover, the voltage drop of the above conductor pattern is suppressed, advantages are obtained that the temperature measuring element can quickly and accurately detect the temperature of the semiconductor laser element, resultantly the temperature measuring element can quickly and accurately perform the temperature control of the semiconductor laser element and improve a power light conversion efficiency due to reduction of the voltage drop of the conductor pattern. These advantages are possible even for a high output semiconductor laser element has resonator length of 1,000 µm or more.

Also in aspects one through four, because the active layer side of the semiconductor laser element is joined to the carrier, the active layer for generating much heat is made to approach a carrier and a submount at a lower layer, heat sink functions of them are maximally shown, and temperature measurement is perform at a high accuracy by a temperature measuring element, advantages are obtained that it is possible to prevent the optical output of the semiconductor laser element from deteriorating and improve the reliability, particularly the service life of the semiconductor laser element. Also, because the temperature control of the semiconductor laser element can be quickly and accurately performed even if the output of a laser beam output from the semiconductor laser element is set to a high output of 250 mW or more, an advantage is obtained that it is possible to prevent the optical output from deteriorating even for a high output semiconductor laser element.

According to the fifth aspect of the invention, because the carrier of a semiconductor laser device is joined to a temperature controlling element such as a Peltier module, a semiconductor laser element and a temperature measuring element are arranged on the carrier, the semiconductor laser element is temperature controlled in accordance with the temperature measured by the temperature measuring element, an advantage is obtained that it is possible to realize a semiconductor laser module capable of preventing the optical output and service life from deteriorating even when the semiconductor laser element has a high output. And because the heat resistance of the heat conducting path between the semiconductor laser element and the temperature controlling element is decreased by decreasing the number of junction faces located on the heat conducting path and respectively formed by a multi-layer film including a gold thin film to four or less, an advantage is obtained that it is possible to accurately and quickly control temperature by the temperature controlling element.

In this application, we describe embodiments using only n type substrate. But p type substrate is adapted to this invention.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

This document claims the benefit of the earlier filing dates of Japanese patent applications 2001-059325 and 2001-319847 filed in the Japanese Patent Office on Mar. 2, 2001 and Oct. 17, 2001 respectively, and the entire contents of both of these Japanese patent applications being incorporated herein by reference.

What is claimed is:

1. A semiconductor laser device comprising:
   a carrier configured to have an insulating characteristic and a high heat conductivity;
   a multi-layer film including a gold thin film mounted on the carrier;
   a semiconductor laser element having a p-side electrode, an n-side electrode, and an end-face, configured to emit a laser beam, and mounted on the multi-layer film via the p-side electrode; and
   a temperature measuring element having a first-side and a second-side, configured to measure a temperature of the semiconductor laser element, and mounted on the multi-layer film via the second-side, wherein
   the semiconductor laser element and the temperature measuring element are placed in a proximity to facilitate a transfer of heat from the laser element p-side to the measuring element second-side without use of a submount.

2. The semiconductor laser device according to claim 1, wherein:
   the carrier comprises at least one of a Si, AlN, diamond and cBN polycrystal material.

3. The semiconductor laser device according to claim 2, wherein:
   the multi-layer film is arranged to form a electrical conducting pattern having a laser mount portion, a measuring element mount portion, a laser n-side portion, and a measuring element first-side portion;
   the semiconductor laser element n-side electrode is connected to the laser n-side portion via a conductive wire connection; and
   the temperature measuring element first-side is connected to the measuring element first-side portion via an other conductive connection.

4. The semiconductor laser device according to claim 3, wherein:
   the conductive connection comprises a plurality of conductive wires, and
   the plurality of conductive wires are joined at substantially equal intervals on the laser n-side portion of the semiconductor laser element.

5. The semiconductor laser device according to claim 3, wherein:
   the laser n-side portion is placed on a portion of the carrier closest to the laser device end-face.

6. The semiconductor laser device according to claim 3, wherein:
   the laser n-side portion is placed on a portion of the carrier opposite to the laser device end-face.

7. The semiconductor laser device according to claim 3, wherein:
   the carrier comprises a conductor rod with a rod thermal conductivity higher than a thermal conductivity of the carrier.

8. The semiconductor laser device according to claim 1, wherein:
   the gold thin film is has a thickness equal to or greater than 5 µm.

9. The semiconductor laser device according to claim 1, further comprising:
   a monitor element mounted on the carrier to monitor the laser beam.

10. The semiconductor laser device according to claim 1, wherein:
    a resonator length of the semiconductor laser element is equal to or greater than 1,000 µm.

11. The semiconductor laser device according to claim 9, wherein:
    at least one of the semiconductor laser element, the temperature measuring element, and the monitor element is electrically independent from an other one of semiconductor laser element, the temperature measuring element, and the monitor element.

12. The semiconductor laser device according to claim 1, wherein:

the semiconductor laser element is configured to output optical power at a level equal to or greater than 250 mW.

13. The semiconductor laser device according to claim 3, wherein:
the carrier is configured to maintain a difference between an actual laser element temperature and a measured laser element temperature less than or equal to 22.5 degrees C. when the semiconductor laser element is driven so as to have a calorific value of 3.5 (W).

14. The semiconductor laser device according to claim 3, wherein:
the carrier is configured to enable the semiconductor laser element to output at least 410 mW of optical power without saturating when injected with an injection current of 1500 mA.

15. A semiconductor laser device comprising:
a carrier configured to have an insulating characteristic and a high heat conductivity;
a submount formed by a heat sink having a heat conductivity equal to or greater than 500 W/(m·K) and joined to the carrier through a first multi-layer film;
a second multi-layer film including a gold thin film mounted on the submount;
a third multi-layer film including a gold thin film mounted on the carrier;
a semiconductor laser element having a p-side electrode, an n-side electrode, and an end-face, configured to emit a laser beam, and mounted on the second multi-layer film via the p-side electrode; and
a temperature measuring element having a first-side and a second-side, configured to measure a temperature of the semiconductor laser element, and mounted on the second multi-layer film via the second-side, wherein
the semiconductor laser element and the temperature measuring element are placed in a proximity to facilitate a transfer of heat from the laser element p-side to the measuring element second-side.

16. The semiconductor laser device according to claim 15, wherein:
the submount comprises diamond.

17. The semiconductor laser device according to claim 16, wherein:
the second multi-layer film is configured to form a conductor pattern having a laser mount portion, a measuring element mount portion, a laser n-side portion, and a measuring element first-side portion,
the third multi-layer film is arranged to form a electrical conducting pattern having an other laser mount portion, an other measuring element mount portion, an other laser n-side portion, and an other measuring element first-side portion,
the semiconductor laser element n-side electrode is connected to the laser n-side portion via a first conductive connection,
the laser mount portion is connected to the other laser mount portion via a second conductive connection,
the laser n-side portion is connected to the other laser n-side portion via a third conductive connection,
the temperature measuring element first-side is connected to the measuring element first-side portion via a fourth conductive connection,
the measuring element first-side portion is connected to the other measuring element first-side portion via a fifth conductive connection, and
the measuring element mount portion is connected to the other measuring element mount portion via a sixth conductive connection.

18. The semiconductor laser device according to claim 17, wherein:
the first conductive connection, second conductive connection and third conductive connection comprises a respective first plurality, second plurality and third plurality of conductive wires,
the first plurality, second plurality and third plurality of conductive wires are each configured to be joined at substantially equal intervals on the respective semiconductor laser element n-side electrode, the laser n-side portion, and other laser n-side portion.

19. The semiconductor laser device according to claim 17, wherein:
the laser n-side portion is placed on a portion of the carrier closest to the laser device end-face.

20. The semiconductor laser device according to claim 17, wherein:
the laser n-side portion is placed on a portion of the carrier opposite to the laser device end-face.

21. The semiconductor laser device according to claim 15, wherein:
the gold thin film has a thickness equal to or greater than 5 $\mu$m.

22. The semiconductor laser device according to claim 15, further comprising:
a monitor element mounted on the carrier to monitor the laser beam.

23. The semiconductor laser device according to claim 15, wherein:
a resonator length of the semiconductor laser element is equal to or greater than 1,000 $\mu$m.

24. The semiconductor laser device according to claim 22, wherein:
at least one of the semiconductor laser element, the temperature measuring element, and the monitor element is electrically independent from an other one of semiconductor laser element, the temperature measuring element, and the monitor element.

25. The semiconductor laser device according to claim 15, wherein:
the semiconductor laser element is configured to have an output power equal to or greater than 250 mW.

26. The semiconductor laser device according to claim 16, wherein:
the diamond submount is configured to minimize heat resistance relative to a semiconductor laser element length, width and thickness.

27. The semiconductor laser device according to claim 26, wherein:
the diamond submount has a thickness of at least 0.4 mm, a length of at least 3.2 mm and a width of at least 3.2 mm when the semiconductor laser element has a thickness of not more than 0.13 mm, a length of not more than 2.0 mm and a width of not more than 0.35 mm.

28. The semiconductor laser device according to claim 26, wherein:
the diamond submount has a thickness of at least 0.3 mm, a length of at least 2.7 mm and a width of at least 1.0 mm when the semiconductor laser element has a thickness of not more than 0.13 mm, a length of not more than 2.0 mm and a width of not more than 0.35 mm.

29. The semiconductor laser device according to claim 16, wherein:

the diamond submount comprises a polycrystal diamond.

30. A semiconductor laser device comprising:
a carrier configured to have an insulating characteristic, a high heat conductivity and a conductor rod with a rod thermal conductivity higher than a thermal conductivity of the carrier;
a multi-layer film including a gold thin film mounted on the carrier;
a semiconductor laser element having a p-side electrode, an n-side electrode, and an end-face, configured to emit a laser beam, and mounted on the multi-layer film via the p-side electrode;
a temperature measuring element having a temperature measuring element first-side and a temperature measuring element second-side, configured to measure a driving temperature of the semiconductor laser element, and mounted on the multi-layer film via the temperature measuring element second-side; and
a laser monitoring element having a laser monitoring element first-side and a laser monitoring element second-side, configured to monitor the laser beam, and mounted on the multi-layer film via the laser monitoring element second-side, wherein
the semiconductor laser element and the temperature measuring element are placed in a proximity to facilitate a transfer of heat from the laser element p-side to the measuring element second-side.

31. The semiconductor laser device according to claim 30, wherein:
the carrier comprises at least one of a Si, AlN, diamond and cBN polycrystal material.

32. The semiconductor laser device according to claim 31, wherein:
the multi-layer film is arranged to form a electrical conducting pattern having a laser mount portion, a measuring element mount portion, a laser monitoring element mount portion, a laser n-side portion, a measuring element first-side portion, and a laser monitoring element first-side portion, wherein
the semiconductor laser element n-side electrode is connected to the laser n-side portion via a first conductive connection,
the temperature measuring element first-side is connected to the measuring element first-side portion via a second conductive connection, and
the laser monitoring element first-side is connected to the laser monitoring element first-side portion via a third conductive connection.

33. The semiconductor laser device according to claim 32, wherein:
the first conductive connection comprises a plurality of conductive wires; and
the plurality of conductive wires are joined at substantially equal intervals on the laser n-side portion of the semiconductor laser element.

34. The semiconductor laser device according to claim 32, wherein:
the laser n-side portion is placed on a portion of the carrier closest to the laser device end-face.

35. The semiconductor laser device according to claim 32, wherein:
the laser n-side portion is placed on a portion of the carrier opposite to the laser device end-face.

36. The semiconductor laser device according to claim 30, wherein:

the gold thin film has a thickness equal to or greater than 5 $\mu$m.

37. The semiconductor laser device according to claim 30, further comprising:
a diamond submount interposed between the carrier and the semiconductor laser element, the temperature measure element and the laser monitoring element, wherein
the diamond submount is joined to the carrier by a multi-layer film including a gold thin film, and
the semiconductor laser element, the temperature measure element and the laser monitoring element are each joined to the diamond submount by a multi-layer film including a gold thin film.

38. The semiconductor laser device according to claim 30, wherein:
a resonator length of the semiconductor laser element is equal to or greater than 1,000 $\mu$m.

39. The semiconductor laser device according to claim 37, wherein:
at least one of the semiconductor laser element, the temperature measuring element, and the monitor element is electrically independent from an other one of semiconductor laser element, the temperature measuring element, and the monitor element.

40. The semiconductor laser device according to claim 30, wherein:
the semiconductor laser element is configured to have an output power equal to or greater than 250 mW.

41. A semiconductor laser device comprising:
a carrier configured to have an insulating characteristic and a high heat conductivity;
a submount formed by a heat sink having a heat conductivity equal to or greater than 500 W/(m·K) and joined to the carrier through a first multi-layer film;
a second multi-layer film including a gold thin film mounted on the submount;
a third multi-layer film including a gold thin film mounted on the carrier;
a semiconductor laser element having a p-side electrode, an n-side electrode, and an end-face, configured to emit a laser beam, and mounted on the second multi-layer film via the p-side electrode; and
a temperature measuring element having a first-side and a second-side, configured to measure a temperature of the semiconductor laser element, and mounted on the third multi-layer film via the second-side, wherein
the semiconductor laser element and the temperature measuring element are placed in a proximity to facilitate a transfer of heat from the laser element p-side to the measuring element second-side.

42. The semiconductor laser device according to claim 41, wherein:
the submount comprises a diamond.

43. The semiconductor laser device according to claim 42, wherein:
the second multi-layer film is configured to form a conductor pattern having a laser mount portion; and
the third multi-layer film is arranged in a pattern to conduct heat and having an other laser mount portion, a measuring element mount portion, a laser n-side portion, and a measuring element first-side portion, wherein
the semiconductor laser element n-side electrode is connected to the laser n-side portion via a first conductive connection, the laser mount portion is connected to the other laser mount portion via a second conductive connection, and the temperature measuring element first-side is connected to the measuring element first-side portion via a third conductive connection.

44. The semiconductor laser device according to claim 43, wherein:

the first conductive connection and second conductive connection comprises a respective first plurality and second plurality of conductive wires, the first plurality and second plurality of conductive wires are each configured to be joined at substantially equal intervals on the respective semiconductor laser element n-side electrode, the laser n-side portion, and other laser n-side portion.

45. The semiconductor laser device according to claim 41, wherein:

the gold thin film has a thickness equal to or greater than 5 μm.

46. The semiconductor laser device according to claim 41, further comprising:

a monitor element mounted on the carrier to monitor the laser beam.

47. The semiconductor laser device according to claim 41, wherein:

a resonator length of the semiconductor laser element is equal to or greater than 1,000 μm.

48. The semiconductor laser device according to claim 46, wherein:

at least one of the semiconductor laser element, the temperature measuring element, and the monitor element is electrically independent from an other one of semiconductor laser element, the temperature measuring element, and the monitor element.

49. The semiconductor laser device according to claim 41, wherein:

the semiconductor laser element is configured to have an output power equal to or greater than 250 mW.

50. The semiconductor laser device according to claim 43, wherein the carrier is configured to enable the semiconductor laser element to output essentially 440 mW of power without saturating when injected with an injection current of 1500 mA.

51. A semiconductor laser device comprising:

a carrier configured to have an insulating characteristic and a high heat conductivity;

a diamond submount covered with a metallic thin film and joined to the carrier through a first multi-layer film;

a second multi-layer film including a gold thin film mounted on the submount;

a third multi-layer film including a gold thin film mounted on the carrier;

a semiconductor laser element configured to emit a laser beam, mounted on the second multi-layer film via the p-side electrode, and having a p-side electrode, an n-side electrode, and an end-face; and a temperature measuring element having a first-side and a second-side, configured to measure a temperature of the semiconductor laser element, and mounted on the third multi-layer film via the second-side, wherein the semiconductor laser element and the temperature measuring element are placed in a proximity to facilitate a transfer of heat from the laser element p-side to the measuring element second-side.

52. The semiconductor laser device according to claim 51, wherein:

the second multi-layer film is configured to form a conductor pattern having a laser mount portion;

the third multi-layer film is configured to form a conductor pattern having a measuring element mount portion, a laser n-side portion, at least one of a laser p-side portion and a sub-mount mount portion, and a measuring element first-side portion;

the semiconductor laser element n-side electrode is connected to the laser n-side portion via a first conductive connection; and the temperature measuring element first-side connects to the measuring element first-side portion via a second conductive connection.

53. The semiconductor laser device according to claim 52, wherein:

the first conductive connection comprises a plurality of conductive wires; and the plurality of conductive wires are each configured to be joined at essentially equal intervals on the respective semiconductor laser element n-side electrode and the laser n-side portion.

54. The semiconductor laser device according to claim 51, wherein:

the gold thin film has a thickness equal to or greater than 5 μm.

55. The semiconductor laser device according to claim 51, further comprising:

a monitor element mounted on the carrier to monitor the laser beam.

56. The semiconductor laser device according to claim 51, wherein:

a resonator length of the semiconductor laser element is equal to or greater than 1,000 μm.

57. The semiconductor laser device according to claim 55, wherein:

at least one of the semiconductor laser element, the temperature measuring element, and the monitor element is electrically independent from an other one of semiconductor laser element, the temperature measuring element, and the monitor element.

58. The semiconductor laser device according to claim 51, wherein:

the semiconductor laser element is configured to have an output power equal to or greater than 250 mW.

59. A semiconductor laser module, comprising:

a laser housing having a housing floor;

a peltier module mounted on the housing floor;

a base mounted on the peltier module;

a semiconductor laser device mounted on the base and having a carrier configured to have an insulating characteristic and a high heat conductivity, a multi-layer film including a gold thin film mounted on the carrier, a semiconductor laser element having a p-side electrode, an n-side electrode, and an end-face, configured to emit a laser beam, and mounted on the multi-layer film via the p-side electrode, and a temperature measuring element having a first-side and a second-side, configured to measure a temperature of the semiconductor laser element, and mounted on the multi-layer film via the second-side, wherein the semiconductor laser element and the temperature measuring element are placed in a proximity to facilitate a transfer of heat from the laser element p-side to the measuring element second-side without use of a submount;

a first lens mounted on the base;

an isolator and a second lens mounted in the package; and an optical fiber.

60. The semiconductor laser module according to claim 59, wherein:

the carrier comprises at least one of a Si, AlN, diamond and cBN polycrystal material.

61. The semiconductor laser module according to claim 60, wherein:

the multi-layer film is arranged to form a conductor pattern having a laser mount portion, a measuring element mount portion, a laser n-side portion, and a measuring element first-side portion;

the semiconductor laser element n-side electrode connects to the laser n-side portion via a conductive connection; and the temperature measuring element first-side connects to the measuring element first-side portion via an other conductive connection.

62. A semiconductor laser module, comprising:

a laser housing having a housing floor;

a peltier module mounted on the housing floor;

a base mounted on the peltier module;

a semiconductor laser device mounted on the base and having a carrier configured to have an insulating characteristic and a high heat conductivity, a submount formed by a heat sink having a heat conductivity equal to or greater than 500 W/(m·K) and joined to the carrier through a first multi-layer film, a second multi-layer film including a gold thin film mounted on the submount, a third multi-layer film including a gold thin film mounted on the carrier, a semiconductor laser element having a p-side electrode, an n-side electrode, and an end-face, configured to emit a laser beam, and mounted on the second multi-layer film via the p-side electrode, and a temperature measuring element having a first-side and a second-side, configured to measure a temperature of the semiconductor laser element, and mounted on the second multi-layer film via the second-side, wherein the semiconductor laser element and the temperature measuring element are placed in a proximity to facilitate a transfer of heat from the laser element p-side to the measuring element second-side;

a first lens mounted on the base;

an isolator and a second lens mounted in the package; and an optical fiber.

63. The semiconductor laser module according to claim 62, wherein:

the submount comprises a diamond.

64. The semiconductor laser module according to claim 63, wherein:

the second multi-layer film is arranged to form a conductor pattern having a laser mount portion, a measuring element mount portion, a laser n-side portion, and a measuring element first-side portion;

the third multi-layer film is configured to form a conductor pattern having an other laser mount portion, an other measuring element mount portion, an other laser n-side portion, and an other measuring element first-side portion, the semiconductor laser element n-side electrode connects to the laser n-side portion via a first conductive connection;

the laser mount portion connects to the other laser mount portion via a second conductive connection;

the laser n-side portion connects to the other laser n-side portion via a third conductive connection;

the temperature measuring element first-side connects to the measuring element first-side portion via a fourth conductive connection;

the measuring element first-side portion connects to the other measuring element first-side portion via a fifth conductive connection; and the measuring element mount portion connects to the other measuring element mount portion via a sixth conductive connection.

65. A semiconductor laser module, comprising:

a laser housing having a housing floor;

a peltier module mounted on the housing floor;

a base mounted on the peltier module;

a semiconductor laser device mounted on the base and having a carrier configured to have an insulating characteristic, a high heat conductivity and a conductor rod configured to have a rod thermal conductivity higher than a thermal conductivity of the carrier, a multi-layer film including a gold thin film mounted on the carrier, a semiconductor laser element having a p-side electrode, an n-side electrode, and an end-face, configured to emit a laser beam, and mounted on the multi-layer film via the p-side electrode, a temperature measuring element having a temperature measuring element first-side and a temperature measuring element second-side, configured to measure a temperature of the semiconductor laser element, and mounted on the multi-layer film via the temperature measuring element second-side, and a laser monitoring element having a laser monitoring element first-side and a laser monitoring element second-side, configured to monitor the laser beam, and mounted on the multi-layer film via the laser monitoring element second-side, wherein the semiconductor laser element and the temperature measuring element are placed in a proximity to facilitate a transfer of heat from the laser element p-side to the measuring element second-side without a submount;

a first lens mounted on the base;

an isolator and a second lens mounted in the package; and an optical fiber.

66. The semiconductor laser module according to claim 65, wherein:

the carrier comprises at least one of a Si, AlN, diamond and cBN polycrystal material.

67. The semiconductor laser module according to claim 66, wherein:

the multi-layer film is arranged to form a conductor pattern having a laser mount portion, a measuring element mount portion, a laser monitoring element mount portion, a laser n-side portion, a measuring element first-side portion and, a laser monitoring element first-side portion;

the semiconductor laser element n-side electrode connects to the laser n-side portion via a first conductive connection;

the temperature measuring element first-side connects to the measuring element first-side portion via a second conductive connection; and the laser monitoring element first-side connects to the laser monitoring element first-side portion via a third conductive connection.

68. A semiconductor laser module, comprising:

a laser housing having a housing floor;

a peltier module mounted on the housing floor;

a base mounted on the peltier module;

a semiconductor laser device mounted on the base and having
  a carrier configured to have an insulating characteristic and a high heat conductivity,
  a submount formed by a heat sink having a heat conductivity equal to or greater than 500 W/(m·K) and joined to the carrier through a first multi-layer film,
  a second multi-layer film including a gold thin film mounted on the submount,
  a third multi-layer film including a gold thin film mounted on the carrier,
  a semiconductor laser element having a p-side electrode, an n-side electrode, and an end-face, configured to emit a laser beam, and mounted on the second multi-layer film via the p-side electrode, and
  a temperature measuring element having a first-side and a second-side, configured to measure a temperature of the semiconductor laser element, and mounted on the third multi-layer film via the second-side, wherein
  the semiconductor laser element and the temperature measuring element are placed in a proximity to facilitate a transfer of heat from the laser element p-side to the measuring element second-side;

a first lens mounted on the base;

an isolator and a second lens mounted in the package; and an optical fiber.

69. The semiconductor laser module according to claim 68, wherein:

the submount comprises a diamond.

70. The semiconductor laser module according to claim 69, wherein:

the second multi-layer film is arranged to form a conductor pattern having a laser mount portion;

the third multi-layer film is configured to form a conductor pattern having an other laser mount portion, a measuring element mount portion, a laser n-side portion, and a measuring element first-side portion;

the semiconductor laser element n-side electrode connects to the laser n-side portion via a first conductive connection;

the laser mount portion connects to the other laser mount portion via a second conductive connection; and the temperature measuring element first-side connects to the measuring element first-side portion via a third conductive connection.

71. A semiconductor laser module, comprising:

a laser housing having a housing floor;

a peltier module mounted on the housing floor;

a base mounted on the peltier module;

a semiconductor laser device mounted on the base and having
  a carrier configured to have an insulating characteristic and a high heat conductivity,
  a diamond submount covered with a metallic thin film and joined to the carrier through a first multi-layer film,
  a second multi-layer film including a gold thin film mounted on the submount,
  a third multi-layer film including a gold thin film mounted on the carrier,
  a semiconductor laser element configured to emit a laser beam, mounted on the second multi-layer film via the p-side electrode, and having a p-side electrode, an n-side electrode, and an end-face, and
  a temperature measuring element having a first-side and a second-side, configured to measure a temperature of the semiconductor laser element, and mounted on the third multi-layer film via the second-side, wherein
  the semiconductor laser element and the temperature measuring element are placed in a proximity to facilitate a transfer of heat from the laser element p-side to the measuring element second-side;

a first lens mounted on the base;

an isolator and a second lens mounted in the package; and an optical fiber.

72. The semiconductor laser module according to claim 71, wherein:

the second multi-layer film is configured to form a conductor pattern having a laser mount portion;

the third multi-layer film is configured to form a conductor pattern having a measuring element mount portion, a laser n-side portion, at least one of a laser p-side portion and a sub-mount mount portion, and a measuring element first-side portion, the semiconductor laser element n-side electrode connects to the laser n-side portion via a first conductive connection; and the temperature measuring element first-side connects to the measuring element first-side portion via a second conductive connection.

73. A semiconductor laser device comprising:

a carrier configured to have an insulating characteristic and a high heat conductivity;

a first and a second multi-layer film including a gold thin film mounted on the carrier;

a semiconductor laser element mounted on the first multi-layer film;

a temperature measuring element mounted on the second multi-layer film;

means for emitting a laser beam; and means for measuring and controlling a temperature of the semiconductor laser element, wherein a number of thermal interfaces between the semiconductor laser element and temperature measuring element is one of two and three.

74. The semiconductor laser device according to claim 73, wherein:

the carrier comprises at least one of a Si, AlN, diamond and cBN polycrystal material.

75. The semiconductor laser device according to claim 74, wherein:
the carrier comprises a thermal conducting rod having a rod thermal conductivity higher than a thermal conductivity of the carrier.

76. The semiconductor laser device according to claim 74, further comprising:
a common submount formed by a heat sink having a heat conductivity equal to or greater than 500 W/(m·K) interposed between the semiconductor laser element and the first multi-layer film and between the temperature monitoring device and the second multi-layer film.

77. The semiconductor laser device according to claim 76, wherein:
the common submount comprises a diamond.

78. The semiconductor laser device according to claim 74, further comprising:
an optical monitor mounted on the carrier via an optical carrier metallic film.

79. The semiconductor laser device according to claim 74, further comprising:
a submount formed by a heat sink having a heat conductivity equal to or greater than 500 W/(m·K) interposed between the semiconductor laser element and the first multi-layer film.

80. The semiconductor laser device according to claim 79, wherein:
the submount comprises a diamond.

81. The semiconductor laser device according to claim 80, wherein:
the submount is covered with a metallic thin film.

82. A semiconductor laser module, comprising:
a laser housing having a housing floor;
a peltier module mounted on the housing floor;
a base mounted on the peltier module;
a semiconductor laser device mounted on the base and having
a carrier configured to have an insulating characteristic and a high heat conductivity,
a first and a second multi-layer film including a gold thin film mounted on the carrier,
a semiconductor laser element mounted on the first multi-layer film,
a temperature measuring element mounted on the second multi-layer film, wherein
a number of thermal interfaces between the semiconductor laser element and temperature measuring element is one of two and three;
a first lens mounted on the base;
an isolator and a second lens mounted in the package;
an optical fiber;
means for emitting a laser beam;
means for measuring and controlling a temperature of the semiconductor laser element; and
means for using a measured temperature to control an output power of the semiconductor laser element.

83. The semiconductor laser module according to claim 81, wherein:
the carrier comprises at least one of a Si, AlN, diamond and cBN polycrystal material.

84. The semiconductor laser module according to claim 82, wherein:
the carrier comprises a thermal conducting rod having a rod thermal conductivity higher than a thermal conductivity of the carrier.

85. The semiconductor laser module according to claim 82, further comprising:
a common submount formed by a heat sink having a heat conductivity equal to or greater than 500 W/(m·K) interposed between the semiconductor laser element and the first multi-layer film and between the temperature monitoring device and the second multi-layer film.

86. The semiconductor laser module according to claim 85, wherein:
the common submount comprises a diamond.

87. The semiconductor laser module according to claim 82, further comprising:
an optical monitor mounted on the carrier via an optical carrier metallic film.

88. The semiconductor laser module according to claim 82, further comprising:
a submount formed by a heat sink having a heat conductivity equal to or greater than 500 W/(m·K) interposed between the semiconductor laser element and the first multi-layer film.

89. The semiconductor laser module according to claim 88, wherein:
the submount comprises a diamond.

90. The semiconductor laser module according to claim 89, wherein:
the submount is covered with a metallic thin film.

* * * * *